(12) United States Patent
Sugiyama et al.

(10) Patent No.: US 12,424,818 B2
(45) Date of Patent: Sep. 23, 2025

(54) LIGHT EMISSION MODULE

(71) Applicant: NICHIA CORPORATION, Anan (JP)

(72) Inventors: Takafumi Sugiyama, Yoshinogawa (JP); Kaname Saito, Anan (JP); Takashi Namie, Anan (JP); Takuya Suzuki, Naruto (JP)

(73) Assignee: NICHIA CORPORATION, Anan (JP)

( * ) Notice: Subject to any disclaimer, the term of this patent is extended or adjusted under 35 U.S.C. 154(b) by 639 days.

(21) Appl. No.: 17/799,255

(22) PCT Filed: Feb. 10, 2021

(86) PCT No.: PCT/JP2021/005025
§ 371 (c)(1),
(2) Date: Aug. 11, 2022

(87) PCT Pub. No.: WO2021/162047
PCT Pub. Date: Aug. 19, 2021

(65) Prior Publication Data
US 2023/0072275 A1     Mar. 9, 2023

(30) Foreign Application Priority Data

Feb. 13, 2020   (JP) .................................. 2020-022399
Feb. 4, 2021    (JP) .................................. 2021-016558

(51) Int. Cl.
*H01S 5/02315*   (2021.01)
*H01S 5/00*      (2006.01)
(Continued)

(52) U.S. Cl.
CPC ........ *H01S 5/02315* (2021.01); *H01S 5/0087* (2021.01); *H01S 5/02255* (2021.01); *H01S 5/0239* (2021.01); *H01S 5/02476* (2013.01)

(58) Field of Classification Search
CPC ............. H01S 5/02469; H01S 5/02476; H01S 5/02208; H01S 5/02212
See application file for complete search history.

(56) References Cited

U.S. PATENT DOCUMENTS 9,946,143 B1     4/2018  Akiyama
2007/0047880 A1  3/2007  Okada
(Continued)

FOREIGN PATENT DOCUMENTS

EP    2 325 956 A2    5/2011
EP    2 797 184 A2    10/2014
(Continued)

OTHER PUBLICATIONS

International Search Report with English translation and Written Opinion issued in the corresponding PCT Application No. PCT/JP2021/005025; dated May 11, 2021; 8 pages.

*Primary Examiner* — Alexander K Garlen
(74) *Attorney, Agent, or Firm* — Foley & Lardner LLP

(57) ABSTRACT

A light emission module includes a first light emission unit that includes a first light emission device and emits first light. The first light emission device includes a plurality of first light emission portions, each including a light emission surface, where light from a plurality of first light emission elements is emitted, a heat dissipation surface provided opposite to the light emission surface, and a connection portion being positioned between the light emission surface and the heat dissipation surface and including a wiring mounting surface where the light emission elements are electrically connected. The light emission module further includes a first optical member that reflects the first light, a housing including a base member where the first light emission unit and the first optical member are disposed and a lid member surrounding the light emission device surrounding the first light emission unit and the first optical (Continued)

member that are disposed on the base member, and a heat sink being connected to the heat dissipation surface and including a mounting surface where the first light emission device is mounted. The wiring mounting surface extends upward upper than a first upper surface of the housing, and a portion of the wiring mounting surface is exposed to the outside of the housing.

13 Claims, 12 Drawing Sheets

(51) Int. Cl.
    *H01S 5/02255*     (2021.01)
    *H01S 5/0239*     (2021.01)
    *H01S 5/024*     (2006.01)

(56) References Cited

U.S. PATENT DOCUMENTS

| | | |
|---|---|---|
| 2009/0224273 A1 | 9/2009 | Sakamoto et al. |
| 2011/0096542 A1 | 4/2011 | Yabe et al. |
| 2013/0039374 A1 | 2/2013 | Lutgen et al. |
| 2013/0057834 A1* | 3/2013 | Yoshida ............... G02B 27/141 353/38 |
| 2013/0170204 A1* | 7/2013 | Sasamuro ........... H01S 5/02253 362/235 |
| 2014/0313715 A1 | 10/2014 | Matsuo et al. |
| 2014/0375970 A1* | 12/2014 | Nagahara ............. G03B 21/204 372/44.01 |
| 2016/0258611 A1 | 9/2016 | Takahashi et al. |
| 2016/0291271 A1 | 10/2016 | Mizobuchi et al. |
| 2017/0261166 A1 | 9/2017 | Ahn et al. |
| 2017/0276546 A1 | 9/2017 | Sakai et al. |
| 2018/0374997 A1 | 12/2018 | Liu et al. |
| 2019/0052049 A1 | 2/2019 | Sato |
| 2019/0064643 A1 | 2/2019 | Morita et al. |
| 2020/0201162 A1 | 6/2020 | Sudo |
| 2021/0208491 A1 | 7/2021 | Tanaka et al. |

FOREIGN PATENT DOCUMENTS

| | | |
|---|---|---|
| JP | 2000-056182 A | 2/2000 |
| JP | 2004-241415 A | 8/2004 |
| JP | 2007-057859 A | 3/2007 |
| JP | 2007-088909 A | 4/2007 |
| JP | 2007-207895 A | 8/2007 |
| JP | 2011-096789 A | 5/2011 |
| JP | 2012-079477 A | 4/2012 |
| JP | 2014-109604 A | 6/2014 |
| JP | 2015-038958 A | 2/2015 |
| JP | 2015-056600 A | 3/2015 |
| JP | 2016-164922 A | 9/2016 |
| JP | 2016-197634 A | 11/2016 |
| JP | 2016-225242 A | 12/2016 |
| JP | 2017-162787 A | 9/2017 |
| JP | 2017-183690 A | 10/2017 |
| JP | 2018-087839 A | 6/2018 |
| JP | 2019-036584 A | 3/2019 |
| JP | 2019-046882 A | 3/2019 |
| JP | 2019-145361 A | 8/2019 |
| WO | WO-2010/147061 A1 | 12/2010 |
| WO | WO-2017/169187 A1 | 10/2017 |
| WO | WO-2018/211886 A1 | 11/2018 |

\* cited by examiner

LIGHT EMISSION MODULE

TECHNICAL FIELD

The present disclosure relates to a light emission module.

BACKGROUND ART

In Patent Literature 1, a light source device is disclosed that includes a light source unit including a plurality of light sources that each emits light having a different color or wavelength from each other and that emits synthesized light obtained by synthesizing the respective light emitted from the light source unit. Furthermore, the light source unit disclosed in Patent Literature 1 also includes a plurality of optical components such as a lens and a mirror, a light detection device, and the like. As exemplified by the light source unit disclosed in Patent Literature 1, a light emission module is already known that includes a light emission element and an optical control component controlling light from the light emission element and that emits desired light.

CITATION LIST

Patent Literature

Patent Literature 1: Japanese Patent Publication No. 2017-183690

SUMMARY OF INVENTION

Technical Problem

An object of the present disclosure is to implement a light emission module that is easy to handle.

Solution to Problem

A light emission module disclosed in an embodiment includes a first light emission unit that includes a first light emission device and emits first light. The first light emission device includes a plurality of first light emission portions, each including a light emission surface, where light from a plurality of first light emission elements is emitted, a heat dissipation surface provided opposite to the light emission surface, and a connection portion being positioned between the light emission surface and the heat dissipation surface and including a wiring mounting surface where the light emission elements are electrically connected. The light emission module further includes a first optical member that reflects the first light, a housing including a base member where the first light emission unit and the first optical member are disposed and a lid member surrounding the light emission device surrounding the first light emission unit and the first optical member that are disposed on the base member, and a heat sink being connected to the heat dissipation surface and including a mounting surface where the first light emission device is mounted. The wiring mounting surface extends upward upper than a first upper surface of the housing, and a portion of the wiring mounting surface is exposed to the outside of the housing.

Advantageous Effects of Invention

According to the present disclosure, a light emission module that is easy to handle can be implemented.

DESCRIPTION OF EMBODIMENTS

Figure 1:
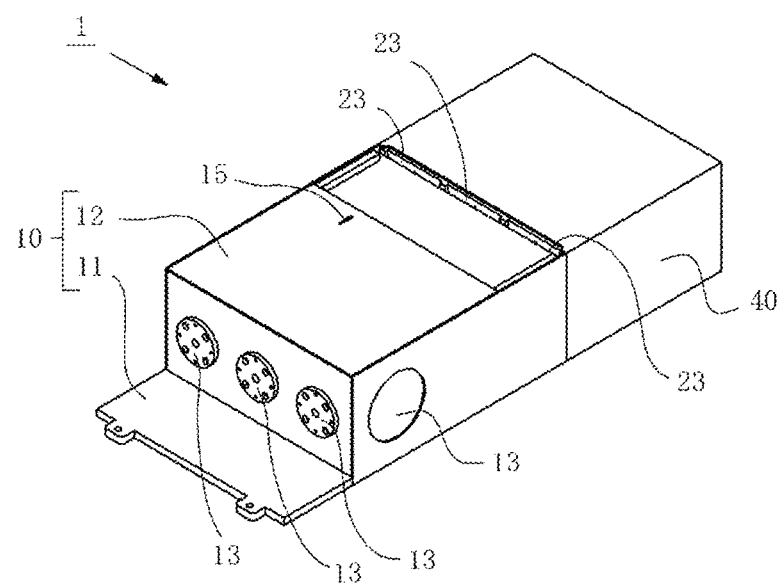
FIG. 1 is a perspective view of a light emission module according to a first embodiment.

In this specification or the scope of the claims, polygons such as triangles and quadrangles, including shapes in which the corners of the polygon are rounded, chamfered, beveled, coved, or the like, are referred to as polygons. Furthermore, a shape obtained by processing not only the corners (ends of sides), but also an intermediate portion of a side is similarly referred to as a polygon.

That is, a shape that is partially processed while remaining a polygon shape as a base is included in the interpretation of "polygon" described in this specification and the scope of the claims.

The same applies not only to polygons but also to words representing specific shapes such as trapezoids, circles, protrusions, and recessions. Furthermore, the same applies when dealing with each side forming that shape. That is, even if processing is performed on a corner or an intermediate portion of a certain side, the interpretation of "side" includes the processed portion. Note that when a "polygon" or "side" not partially processed is to be distinguished from a processed shape, "strict" will be added to the description as in, for example, "strict quadrangle".

Furthermore, in this specification or the scope of the claims, expressions such as upper and lower, left and right, top and bottom, front and back, near and far, and the like are used merely to describe a relative relationship of positions, orientations, directions, and the like, and the expressions need not necessarily match an actual relationship at a time of use. For example, with respect to a component and a finished product, even if an upper surface of the component is mounted so as to be positioned at a lateral surface of the finished product, the upper surface for that component remains the same.

Furthermore, in this specification or the scope of the claims, when there are a plurality of components corresponding to a certain component and each of the components is to be individually expressed, the components may be distinguished by adding the terms "first" and "second" in front of the component term. Furthermore, when objects or viewpoints to be distinguished differ between this specification and the scope of the claims, the same added terms in the specification and the scope of the claims may not refer to the same objects.

For example, in this specification, when there are objects distinguished by being termed "first", "second", and "third", and when the scope of the claims is to be described for only the "first" and "third" objects of the specification, from a perspective of ease of understanding, the objects may be distinguished by being termed "first" and "second" in the scope of the claims. In this case, the objects termed "first" and "second" in the scope of the claims refers to the objects termed "first" and "third" in the specification.

Embodiments for implementing the present invention are described below with reference to the drawings. However, the illustrated embodiments are for embodying the technical concept of the present invention but are not intended to limit the present invention. Furthermore, in the descriptions below, the same term or reference numeral represents the same member or a similar member, and duplicate descriptions will be omitted as appropriate. Note that sizes, positional relationships, and the like of members illustrated in the drawings may sometimes be exaggerated in order to facilitate understanding.

First Embodiment

Figure 2:
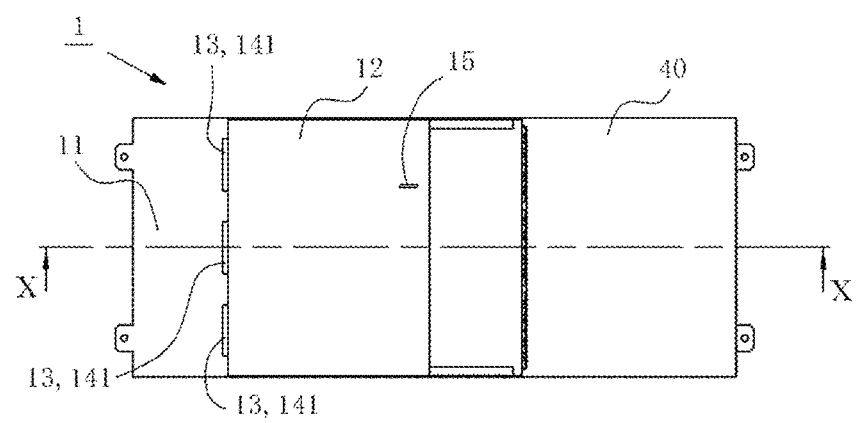
FIG. 2 is a top view of the light emission module according to the first embodiment.
Figure 3:
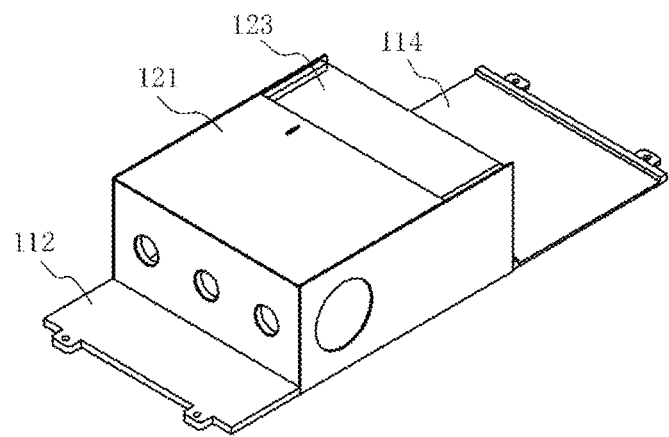
FIG. 3 is a perspective view, when viewed from a certain direction, of a housing of the light emission module according to the first embodiment.
Figure 4:
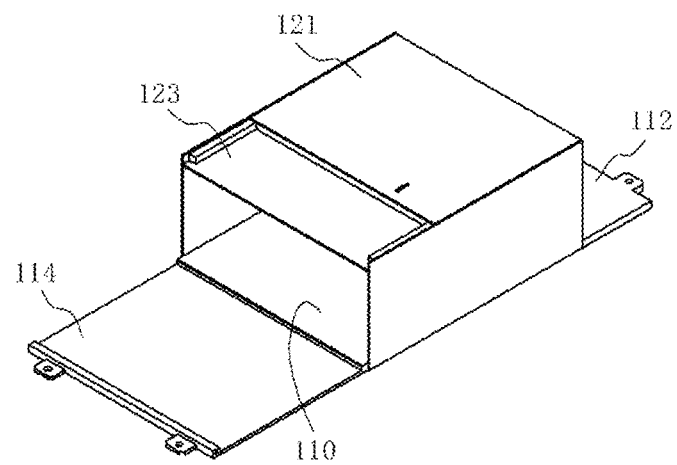
FIG. 4 is a perspective view, when viewed from a direction different from the direction in FIG. 3, of the housing of the light emission module according to the first embodiment.
Figure 5:
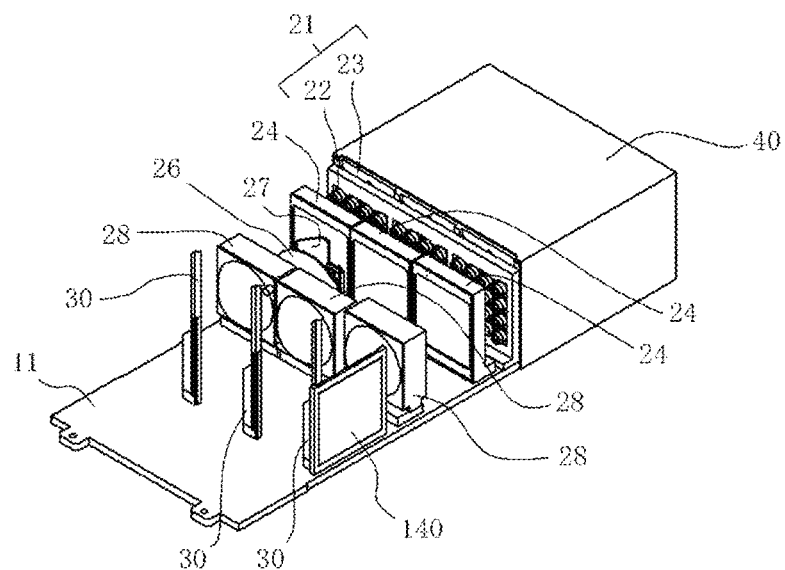
FIG. 5 is a perspective view of the light emission module according to the first embodiment from which a lid member of the housing is removed.
Figure 6:
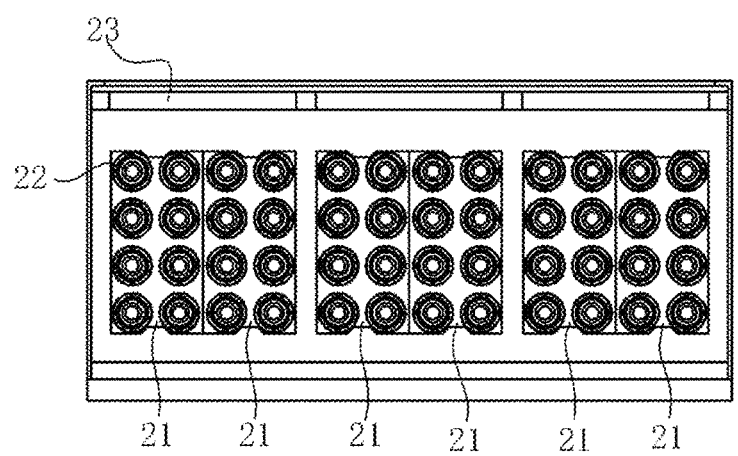
FIG. 6 is a schematic view illustrating an arrangement of light emission devices in the light emission module according to the first embodiment.
Figure 7:
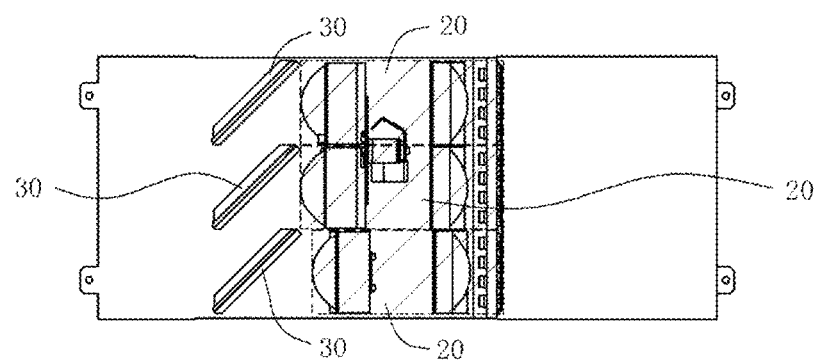
FIG. 7 is a top view of the light emission module according to the first embodiment from which the lid member of the housing is removed.
Figure 8:
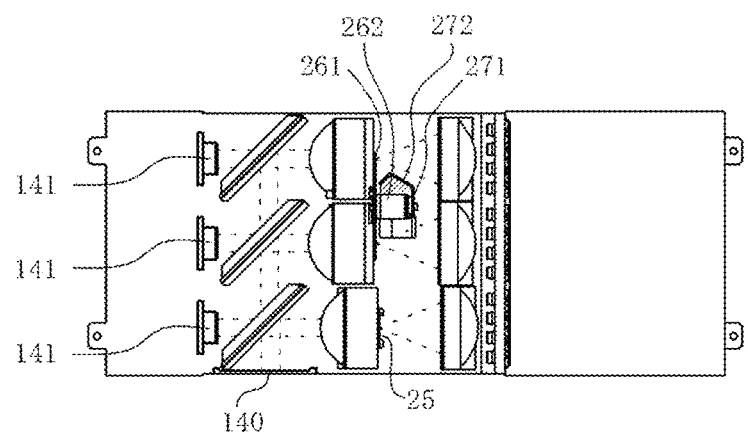
FIG. 8 is a top view for illustrating an optical path of light in the light emission module according to the first embodiment.
Figure 9:
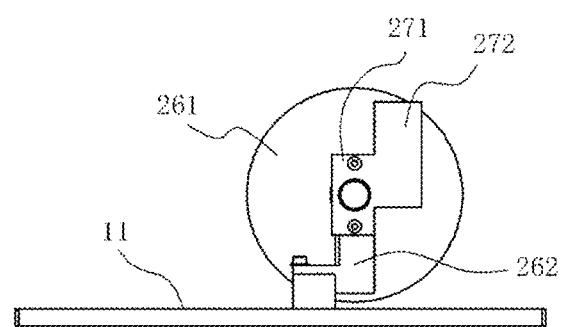
FIG. 9 is a lateral view for illustrating an arrangement of a wavelength conversion member and a protection member in the light emission module according to the first embodiment.
Figure 10:
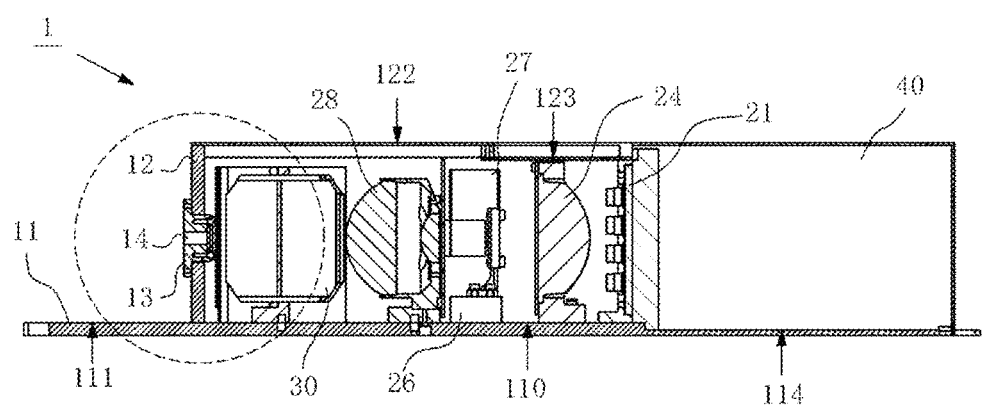
FIG. 10 is a cross-sectional view of the light emission module taken along a line X-X in FIG. 2.
Figure 11:
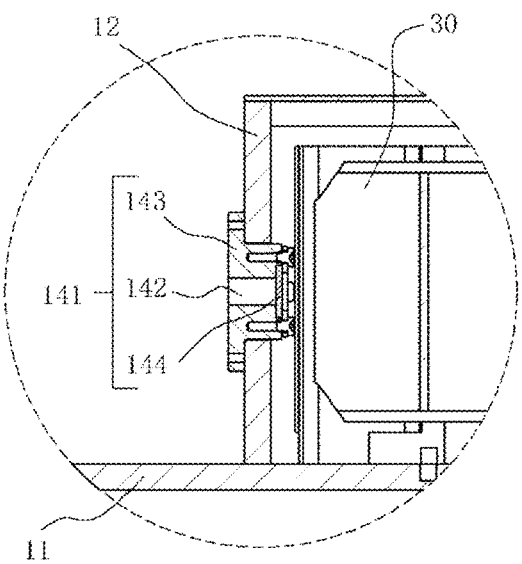
FIG. 11 is an enlarged view of a portion encircled by a broken line in the cross-sectional view of FIG. 10.
Figure 12:
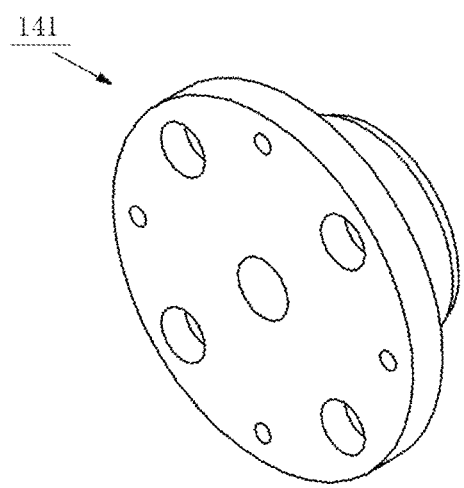
FIG. 12 is a perspective view of a light guide unit in the light emission module according to the first embodiment.

A light emission module 1 according to a first embodiment will be described. FIGS. 1 to 12 are drawings for illustrating an exemplary form of the light emission module 1. FIG. 1 is a perspective view of the light emission module 1. FIG. 2 is a top view of the light emission module 1. FIGS. 3 and 4 are perspective views of a housing 10 of the light emission module 1. FIG. 5 is a perspective view of a state in which a lid member 12 of the housing 10 is removed from the light emission module 1. FIG. 6 is a schematic view illustrating an arrangement of light emission devices 21 in the light emission module 1. FIG. 7 is a top view of the state in which the lid member 12 of the housing 10 is removed from the light emission module 1. FIG. 8 is a top view for illustrating an optical path in the light emission module 1. FIG. 9 is a lateral view for illustrating an arrangement of a wavelength conversion member 26 and a protection member 27 in the light emission module 1. FIG. 10 is a cross-sectional view taken along a cross-sectional line X-X in FIG. 2. FIG. 11 is an enlarged view of a portion, of a window portion 13, encircled by a broken line in the cross-sectional view of FIG. 10. FIG. 12 is a perspective view of a light guide unit 141 constituting the window portion 13 in the light emission module 1.

Note that in FIG. 3, each of the light guide units 141 of three of the window portions 13 included in the housing 10 is omitted. Furthermore, in the perspective view of FIG. 5, a light-transmissive member 140 of the window portion 13 included in the lid member 12 is not omitted. Furthermore, in the top view of FIG. 7, a portion constituting a single light emission unit 20 is surrounded by a broken line frame and illustrated with hatching. Furthermore, in FIG. 8, the optical path of light is indicated by a dotted line, and for convenience, the light-transmissive member 140 and three of the light guide units 141 are illustrated. Furthermore, in FIG. 8, a protection region for protecting a wiring, which is formed by the protection member 27, is illustrated with hatching. Furthermore, FIG. 9 is a lateral view of the wavelength conversion member 26 and the protection member 27 disposed at a base member 11 when viewed from the light emission device 21 of the light emission unit 20, and the other components are omitted.

The light emission module 1 includes a plurality of components including the housing 10, one or a plurality of light emission units 20, one or a plurality of optical members 30, and a heat sink 40. For example, the light emission module 1 illustrated in the drawings includes the plurality of light emission units 20 and the plurality of optical members 30. Specifically, the light emission module 1 illustrated in the drawings includes three of the light emission units 20 and three of the optical members 30.

The light emission module 1 controls light emitted from the one or the plurality of the light emission units 20 and causes the light to emit to the outside. Furthermore, the one or the plurality of the light emission units 20 are disposed inside the housing 10. The light emitted from the one or the plurality of the light emission units 20 is emitted from a predetermined location of the housing 10 to the outside.

Furthermore, the one or the plurality of the optical members 30 are disposed inside the housing 10. The one or the plurality of the optical members 30 control the light emitted from the one or the plurality of the light emission units 20. Furthermore, heat generated from the one or the plurality of the light emission units 20 is dissipated by the heat sink 40.

First, each of the components will be described.

Housing 10

The housing 10 includes an upper surface, a lower surface, and a plurality of lateral surfaces. Furthermore, the housing 10 may have a plurality of upper surfaces. In the example of the light emission module 1 illustrated in the drawings, the housing 10 includes three of the upper surfaces and three of the lateral surfaces.

The housing 10 includes an arrangement region 110 in which one or a plurality of components are disposed. The arrangement region 110 is constituted by a single flat surface. Note that the arrangement region 110 may be constituted by a plurality of flat surfaces. For example, the arrangement region 110 may have a stepped structure, and the components may be disposed on the flat surfaces at both upper and lower stages.

The plurality of lateral surfaces of the housing 10 meet the flat surface including the arrangement region 110 and extend upward from this flat surface. Furthermore, the plurality of lateral surfaces include two lateral surfaces (two first lateral surfaces) facing each other. The two first lateral surfaces face each other with an arrangement surface interposed therebetween. Furthermore, the plurality of lateral surfaces include a lateral surface (a second lateral surface) that connects the two first lateral surfaces. Note that the second lateral surface may connect the two first lateral surfaces via one or a plurality of other lateral surfaces.

The plurality of lateral surfaces of the housing 10 do not surround the entire periphery of the arrangement region 110. Furthermore, a portion, of the housing 10, at which the lateral surface is not provided is an opening (see FIG. 4). The opening in the housing 10 is provided between the upper surface and the lower surface and between the two first lateral surfaces. Note that the plurality of lateral surfaces may surround the entire periphery of the arrangement region 110.

In the example of the light emission module 1 illustrated in the drawings, the housing 10 includes the two first lateral surfaces facing each other with the arrangement region 110 interposed therebetween and the single second lateral surface meeting the two first lateral surfaces. Furthermore, of each of the two first lateral surfaces, a side located opposite to the side meeting the second lateral surface constitutes a portion of the outer edge defining the opening.

The lateral surfaces meeting the flat surface including the arrangement region 110 meet an upper surface 121 (a first upper surface) on the opposite to a portion meeting the flat surface including the arrangement region 110. In the example of the light emission module 1 illustrated in the drawings, the housing 10 includes a plurality of upper surfaces including the first upper surface. The plurality of upper surfaces include an upper surface 112 (a second upper surface) provided outside the arrangement region 110 with the lateral surface as a boundary therebetween. Furthermore, the plurality of upper surfaces include an upper surface 123 (a third upper surface) meeting the lateral surfaces opposite to the portion meeting the flat surface including the arrangement region 110 and being positioned below the first upper surface.

In the example of the light emission module 1 illustrated in the drawings, in a top view, the first upper surface is provided between the second upper surface and the third upper surface. Furthermore, in a top view, the housing 10 includes an upper surface 114 (a fourth upper surface) provided on the opposite to the second upper surface with respect to the first upper surface and the third upper surface. Thus, the first upper surface is provided between the second upper surface and the fourth upper surface. Furthermore, the third upper surface is provided between the second upper surface and the fourth upper surface.

The housing 10 includes the window portion 13 including a region through which light passes. Furthermore, the housing 10 includes a plurality of window portions 13. Each of the plurality of window portions 13 is provided on one of the surfaces constituting the housing 10. Furthermore, each of the plurality of window portions 13 is provided on one of the plurality of lateral surfaces. Note that the window portion 13 may be provided on the first upper surface.

Furthermore, the plurality of window portions 13 are provided on a plurality of surfaces of the housing 10. In other words, at least one of the window portions 13 is provided on the first surface of the housing 10, and at least one of the window portions 13 is provided on the second surface of the housing 10. Note that the plurality of window portions 13 may be provided on three or more different surfaces of the housing 10. Furthermore, the plurality of window portions 13 may be provided on one surface of the housing 10.

The housing 10 includes a surface in which two or more of the window portions 13 of the plurality of window portions 13 are provided and a surface in which only one of the window portions 13 of the plurality of window portions 13 is provided. Note that the housing 10 need not necessarily include the surface in which two or more of the window portions 13 are provided.

In the example of the light emission module 1 illustrated in the drawings, the housing 10 includes four of the window portions 13, as the plurality of window portions 13. Furthermore, the plurality of window portions 13 are provided on one of the two first lateral surfaces and the second lateral surface. Furthermore, the number of lateral surfaces including the window portion 13 is two. Furthermore, only one of the window portions 13 is provided on the first lateral surface. Furthermore, two or more of the window portions 13 are provided on the second lateral surface.

The plurality of window portions 13 include an emission port 14, which serves as a light extraction port. The plurality of window portions 13 include two or more of the window portions 13 including the emission ports 14 whose areas are different from each other. In the example of the light emission module 1 illustrated in the drawings, the plurality of window portions 13 include two of the window portions 13 including the emission ports 14 whose areas are different from each other. Furthermore, the window portion 13 provided on the first lateral surface includes the emission port 14 having an area larger than an area of the emission port 14 included in any one of the window portions 13 provided on the second lateral surface.

The housing 10 includes a surface in which one or a plurality of through holes are formed. Furthermore, the housing 10 includes a plurality of surfaces in which at least one of the through holes is formed. The plurality of through holes are formed in a plurality of surfaces of the housing 10. The plurality of through holes correspond to the plurality of window portions 13. In other words, the through hole is formed on the surface in which the window portion 13 is provided (see FIG. 3). Furthermore, the emission port 14 is provided inside this through hole. Note that the through hole may be the emission port 14.

The window portion 13 is provided in each of the plurality of through holes. Note that the through hole may be the window portion 13 of the housing 10. The window portion 13 is formed, for example, by blocking the through hole with the light-transmissive member 140. As the light-transmissive member 140, for example, glass having light-transmissiveness can be used. Here, having the light-transmissiveness means having a transmittance of 90% or greater with respect to visible light or light of a specific wavelength range (color) of visible light.

Furthermore, for example, the window portion 13 is formed by fitting the light guide unit 141 including a light guide path into the through hole. The light guide unit 141 is constituted, for example, by including a light guide member 142, a connection member 143, and a filter 144 (see FIG. 7 in particular for the light guide unit 141).

The light guide member 142 includes the light guide path through which light passes. The light guide path is, for example, a hollow space. An incident surface and an emission surface of light in this light guide path are smaller than the through hole. The emission surface of the light guide path forms the emission port 14 of the window portion 13 or is connected to the emission port 14.

The connection member 143 holds the light guide member 142 and is connected to the surface in which the through hole is formed. A screw, an adhesive, or the like can be used for the connection.

The filter 144 transmits or shields light in a predetermined wavelength range. By providing the filter 144, the wavelength range of light that can be emitted from the emission port 14 can be limited.

Furthermore, a connection hole 15 is formed in the housing 10. The connection hole 15 is formed in the first upper surface. In the example of the light emission module 1 illustrated in the drawings, the connection hole 15 is provided at a position close to the third upper surface. Furthermore, in a top view, a distance from the third upper surface to the connection hole 15 is shorter than a distance from the second upper surface to the connection hole 15. Furthermore, the window portion 13 provided in the first lateral surface is provided at a position close to the second lateral surface.

The housing 10 is formed by connecting parts including the base member 11 and the lid member 12. The base member 11 includes the arrangement region 110. Furthermore, the base member 11 includes the lower surface. The lid member 12 includes the plurality of lateral surfaces meeting the arrangement region 110 and the first upper surface. The lid member 12 includes the plurality of window portions 13. Furthermore, the connection hole 15 is formed on the lid member 12. In the example of the light emission module 1 illustrated in the drawings, the base member 11 further includes the second top surface. Furthermore, the base member 11 further includes the fourth upper surface. The lid member 12 includes the third upper surface.

Each of the surfaces of the housing 10 can be formed using a metal, such as aluminum, as a main material. Each of the surfaces of the housing 10 is formed by a material having light shielding properties, except for the emission port 14 of the window portion 13. It is here assumed that having the light shielding properties means that the transmittance with respect to visible light is 5.0% or less. Note that a material other than the metal may be used as the main material. Furthermore, a surface treatment may be performed to obtain the light shielding properties.

Light Emission Unit 20

The light emission unit 20 is a unit that includes one or a plurality of light emission elements and is constituted by one or a plurality of components including the light emission element. For example, the light emission unit 20 can be constituted by including the wavelength conversion member 26 in addition to the light emission element. Furthermore, for example, the light emission unit 20 can be constituted by including an optical member in addition to the light emission element.

The light emission unit 20 is a unit for emitting light of a specific wavelength range. The light of the specific wavelength range is included, for example, in a wavelength range of light emitted from the light emission element. Furthermore, for example, the light of the specific wavelength range is included in a wavelength range of light emitted after being converted by the wavelength conversion member based on the light from the light emission element.

The light of the specific wavelength range includes light at a peak wavelength emitted from the light emission unit 20. Furthermore, when the light of the specific wavelength range is included in the light emitted from the light emission element, the peak wavelength of the light emitted from the light emission element is included in the specific wavelength range. When the light of the specific wavelength range is the light emitted after being converted by the wavelength conversion member, a peak wavelength of the light emitted after being converted by the wavelength conversion member is included in the specific wavelength range.

Furthermore, the light emission unit 20 can be constituted by including an optical member 24. The optical member 24 is, for example, a condensing lens. Furthermore, the light emission unit 20 can be constituted by including an optical member 28. The optical member 28 is, for example, a collimating lens. Furthermore, the light emission unit 20 can be constituted by including an optical member 25. The optical member 25 is, for example, a diffusion plate.

The light emission units 20 can be constituted by including a plurality of optical members. Furthermore, the plurality of optical members include the optical member 24, the optical member 28, or the optical member 25. Note that optical members other than those described above may be included. Furthermore, some or all of those optical members need not necessarily be included.

For example, the light emission unit 20 can be constituted by including a plurality of light emission elements, the condensing lens (the optical member 24) that condenses light emitted from the plurality of light emission elements, the diffusion plate (the optical member 25) that diffuses the condensed light, and the collimating lens (the optical member 28) that collimates the diffused light. According to such a configuration, the light emission unit 20 can emit the collimated light in which the light emitted from the plurality of light emission elements are condensed.

Furthermore, for example, the light emission unit 20 can be constituted by including the plurality of light emission elements, the condensing lens (the optical member 24) that condenses the light emitted from the plurality of light emission elements, the wavelength conversion member 26 on which the condensed light is incident, and the collimating lens (the optical member 28) that collimates the light emitted by the wavelength conversion member 26. According to such a configuration, the light emission unit 20 can emit the collimated light of the light emitted by the wavelength conversion member 26.

Furthermore, the light emission unit 20 can be constituted by including one or a plurality of light emission devices 21 on which the plurality of light emission elements are mounted. Furthermore, the light emission device 21 includes one or a plurality of light emission portions 22 that emit the light from the plurality of light emission elements to the outside. Furthermore, the light emission device 21 includes a connection portion 23 that is electrically connected to the plurality of light emission elements.

The light emission portion 22 includes a light emission surface that emits light. The light emission surfaces of the one or the plurality of the light emission portions 22 are mounted to face the same direction. The light emission device 21 includes a first mounting surface on which the one or the plurality of the light emission portions 22 are mounted and a second mounting surface opposite to the first mounting surface. The first mounting surface is a surface facing the same direction as the light emission surface of the light emission portion 22. The second mounting surface is a surface facing the opposite direction to the direction in which the light emission surface of the light emission portion 22 faces. The second mounting surface is a surface that is provided opposite to the light emission surface of the light emission portion 22.

The connection portion 23 includes a first surface provided with a wiring region for wirings and a second surface opposite to the first surface. The first surface of the connection portion 23 is positioned between the light emission surface and the second mounting surface. Furthermore, the first surface of the connection portion 23 is positioned between the first mounting surface and the second mounting surface.

In the example of the light emission module 1 illustrated in the drawings, the light emission unit 20 includes the plurality of light emission devices 21. Furthermore, each of the light emission devices 21 includes the plurality of light emission portions 22. Furthermore, the plurality of light emission portions 22 are disposed in a matrix pattern. In one of the light emission units 20, two of the light emission devices 21 are arranged next to each other while each of the light emission devices 21 including four rows and two columns of the light emission portions 22, namely, four rows and four columns of the light emission portions 22 are disposed therein.

A semiconductor laser element is employed as the light emission element. Furthermore, an LED, an organic EL, or the like may be employed as the light emission element. For example, the light emission element may employ light having an emission peak wavelength within a range from 365 nm to 494 nm. Note that light having a peak wavelength outside this range may also be employed. Furthermore, the range is not limited to the wavelength range of the visible light. For example, light having a peak wavelength in a wavelength range of ultraviolet light may be used.

For example, the plurality of light emission elements include a light emission element that emits blue light. Furthermore, for example, the plurality of light emission elements include a light emission element that emits purple light. Note that the light emission element may be a light emission element that emits light of a color other than those described above.

All of the light emission elements included in one of the light emission units 20 emit light of the same color. When the light emission module 1 includes the plurality of light emission units 20, the plurality of light emission units 20 may include two or more of the light emission units 20 that emit light of mutually different colors, respectively.

Here, the blue light refers to light having the emission peak wavelength within a range from 430 nm to 494 nm. The purple light refers to light having the emission peak wavelength within a range from 365 nm to 430 nm. Examples of the light emission element that emits the blue light or the purple light include a semiconductor laser element including a nitride semiconductor. GaN, InGaN, and AlGaN, for example, can be used as the nitride semiconductor.

The wavelength conversion member 26 emits light at different wavelengths based on a portion or all of light at a predetermined wavelengths incident on the wavelength conversion member 26. In other words, the wavelength conversion member 26 emits only a portion or not all of the light at the predetermined wavelengths incident on the wavelength conversion member 26. Furthermore, as a result of the light at the predetermined wavelength being incident on the wavelength conversion member 26, the wavelength conversion member 26 emits light at a different wavelength from the wavelength of the incident light.

The wavelength conversion member 26 includes, for example, phosphor. As the phosphor, for example, a garnet-based phosphor such as YAG or LAG can be employed. Furthermore, other phosphors can also be employed.

Furthermore, the wavelength conversion member 26 can be constituted by including a wavelength conversion portion 261 and a conversion control portion 262. The wavelength conversion portion 261 emits light whose wavelength has been converted to a different wavelength. The conversion control portion 262 controls an operation of the wavelength conversion portion 261 or controls an effect of wavelength conversion by the wavelength conversion portion 261. The wavelength conversion portion 261 is connected to the conversion control portion 262.

The wavelength conversion portion 261 includes, for example, phosphor. For example, a phosphor wheel or a phosphor plate can be employed as the wavelength conversion portion 261. As the conversion control portion 262, for example, a motor for controlling the rotation of the phosphor wheel, a shutter for controlling the incidence of light on the phosphor plate, or the like can be employed. By using the phosphor wheel while rotating it, it is possible to disperse heat of the phosphor generated by irradiation of light and reduce deterioration of the phosphor wheel.

The conversion control portion 262 operates as a result of power being supplied thereto. Therefore, the conversion control portion 262 includes a connection portion for electrically connecting to an external power source. In the example of the light emission module 1 illustrated in the drawings, the phosphor wheel is employed as the wavelength conversion portion 261, and a motor that rotates the wheel is employed as the conversion control portion 262.

Furthermore, the light emission unit 20 can be constituted by including the protection member 27. The protection member 27 is disposed in the vicinity of the wavelength conversion member 26. Furthermore, the protection member 27 includes a connection portion 271 connected to the wavelength conversion member 26. Furthermore, the protection member 27 is connected to the conversion control portion 262. The protection member 27 is connected to the conversion control portion 262 at a surface opposite to a surface, of the conversion control portion 262, to which the wavelength conversion portion 261 is connected.

The protection member 27 is disposed in the vicinity of the wavelength conversion portion 261 at a position where the protection member 27 does not contact the wavelength conversion portion 261. The protection member 27 includes a protection portion 272 that extends from the position at which the protection member 27 is connected to the conversion control portion 262 in a direction toward the wavelength conversion portion 261. The protection portion 272 has a structure obtained by folding a flat plate at an intermediate point. The tip of the protection portion 272 is disposed at a position closest to the wavelength conversion portion 261.

By disposing the protection member 27, light traveling toward the wavelength conversion portion 261 is not obstructed by the wiring connected to the connection portion of the conversion control portion 262, and light incident on the wavelength conversion portion 261 can be protected from the wiring. Examples in which the wiring obstructs the wavelength conversion include a case in which the wavelength conversion portion 261 comes into contact with the wiring or a case in which the wiring is disposed on the optical path of the light.

Optical Member 30

The optical member 30 has high reflectance with respect to light in a predetermined wavelength range. Here, the high reflectance means a reflectance of 95% or greater, for example. Furthermore, in other words, it can be rephrased as having a transmittance of less than 5% with respect to the light in the predetermined wavelength range.

Furthermore, the optical member 30 has high transmittance with respect to light in a wavelength range different from the wavelength range for which it has high reflectance. Here, the high transmittance means a transmittance of 90% or greater, for example. The optical member 30 is, for example, a dichroic mirror.

Heat Sink 40

The heat sink 40 includes an upper surface, a lower surface, and a lateral surface. Furthermore, the heat sink 40 also includes a mounting surface on which a heat source is mounted. Any of the upper surface, the lower surface, or the lateral surface can be the mounting surface. The heat sink 40 dissipates heat generated from the heat source mounted at the mounting surface to the outside of the light emission module.

Note that the heat sink 40 may further include one or a plurality of the lateral surfaces. In the example of the light emission module 1 illustrated in the drawings, the heat sink 40 has a rectangular parallelepiped outer shape.

Light Emission Module 1

Next, the light emission module 1 will be described. The one or the plurality of the light emission units 20 are disposed in the arrangement region 110 of the housing 10. Furthermore, the one or the plurality of the optical members 30 are disposed in the arrangement region 110 of the housing 10. Furthermore, the heat sink 40 is disposed in the vicinity of the opening formed in a part of the housing 10. Alternatively, the heat sink 40 may be disposed in the vicinity of the opening in a state in which the opening is blocked.

In the example of the light emission module 1 illustrated in the drawings, the plurality of light emission units 20 are disposed in the arrangement region 110 of the base member 11 of the housing 10. The plurality of optical members 30 are disposed in the arrangement region 110 of the base member 11 of the housing 10. The heat sink 40 is disposed on the fourth upper surface of the base member 11 of the housing 10. Furthermore, in a top view, the lid member 12 of the housing 10 and the heat sink 40 are disposed next to each other. The lateral surface of the heat sink 40 is provided in the vicinity of the opening of the housing 10.

The housing 10 surrounds the one or the plurality of the light emission units 20. Furthermore, the housing 10 surrounds the one or the plurality of the optical members 30. The upper surface of the housing 10 is provided immediately above the one or the plurality of the light emission units 20. Furthermore, the upper surface of the housing 10 is provided immediately above the one or the plurality of the optical members 30. Note that a portion of the one or the plurality of the light emission units 20 may be exposed from the opening. In other words, the upper surface of housing 10 need not necessarily be provided immediately above this portion.

The one or the plurality of the light emission units 20 are surrounded by the lower surface and the plurality of lateral surfaces of the housing 10. Furthermore, the one or the plurality of the light emission units 20 are disposed between the upper surface and the lower surface of the housing 10, between the two first lateral surfaces of the housing 10, and between the second lateral surface of the housing 10 and the lateral surface of the heat sink 40. In this paragraph, the same also applies when "the one or the plurality of the light emission units 20" is replaced with "the one or the plurality of the optical members 30".

In the example of the light emission module 1 illustrated in the drawings, the plurality of light emission units 20 are arranged next to each other, from one of the first lateral surfaces to the other of the first lateral surfaces. Furthermore, the plurality of optical members 30 are disposed in the arrangement region 110 of the base member 11 of the housing 10. Furthermore, the plurality of optical members 30 are arranged next to each other, from one of the first lateral surfaces to the other of the first lateral surfaces.

The one or the plurality of the light emission devices 21 included in the light emission unit 20 are mounted on the mounting surface of the heat sink 40. Thus, the light emission device 21 mounted on the mounting surface of the heat sink 40 is disposed in the arrangement region 110 of the housing 10.

The second mounting surface of the light emission device 21 is connected to the mounting surface of the heat sink 40. The second mounting surface is a heat dissipation surface that dissipates heat generated by the light emission elements of the light emission device 21, to the heat sink. The second mounting surface may be joined with the mounting surface of the heat sink 40 directly or via another member. When the second mounting surface is joined with the mounting surface of the heat sink 40 via the other member, it is preferable to take care to prevent this configuration from significantly impairing the heat dissipating effect.

In a plan view parallel to the mounting surface of the heat sink 40, the one or the plurality of the light emission elements 21 are mounted not to protrude from the mounting surface of the heat sink 40. The outer edge of the second mounting surface of the light emission element 21 is positioned inward of the outer edge of the mounting surface of the heat sink 40. In this way, the heat dissipation effect can be improved.

In the example of the light emission module 1 illustrated in the drawings, the lateral surface of the heat sink 40 disposed in the vicinity of the opening is the mounting surface on which the heat source is mounted. Furthermore, the plurality of light emission devices 21 are mounted on the mounting surface of the heat sink 40. Furthermore, all of the plurality of light emission devices 21 included in the plurality of light emission units 20 are mounted on the mounting surface of the heat sink 40. Each of the light emission devices 21 emits light from the plurality of light emission portions 22 in a direction toward the second lateral surface of the housing 10.

The connection portion 23 of the one or the plurality of the light emission devices 21 included in the light emission module 1 extends upwards upper than the third upper surface of the housing 10, and a portion thereof is exposed to the outside of the housing 10. Furthermore, the connection portion 23 extends upward from below the third upper surface of the housing 10. In other words, a portion of the connection portion 23 protrudes from the third upper surface of the housing 10. By exposing the connection portion 23, connection to an external wiring can be easily made. The external wiring is connected to the first surface of the connection portion 23, for example. The first surface of the connection portion 23 can be referred to as a wiring mounting surface to which the one or the plurality of the light emission elements 21 are electrically connected.

Furthermore, the connection portion 23 is disposed below the first upper surface of the housing 10. In other words, the connection portion 23 does not extend upward upper than the first upper surface of the housing 10. In the housing 10, by providing the third upper surface below the first upper surface and exposing the connection portion 23 between the first upper surface and the third upper surface, the connection portion 23 can be protected. For example, even if a flat surface of another module is disposed on the first upper surface of the light emission module 1, contact between the other module and the connection portion 23 can be avoided, and thus, the light emission module 1 that is easy to handle can be implemented.

Furthermore, the connection portion 23 is disposed below the upper surface of the heat sink 40. In other words, the connection portion 23 does not extend upward upper than the upper surface of the heat sink 40. For example, even if a flat surface of another module is disposed on the first upper surface of the housing 10 and the upper surface of the heat sink 40, contact between the other module and the connection portion 23 can be avoided. Furthermore, the height of the first upper surface of the housing 10 is equal to the height of the upper surface of the heat sink 40. When the flat surface of the other module is disposed on the first upper surface of the housing 10 and the upper surface of the heat sink 40, the installation of the other module is stabilized.

Furthermore, in the example of the light emission module 1 illustrated in the drawings, the plurality of light emission units 20 includes a light emission unit 20 including the wavelength conversion member 26. In the light emission unit 20 having such a configuration, light wavelength-converted by the wavelength conversion member 26 becomes the light of the specific wavelength range emitted from the light emission unit 20. In this case, light emitted from the light emission element but not included in a wavelength range of the light to be wavelength-converted does not become the light of the specific wavelength range.

For example, the light emission module 1 illustrated in the drawings includes, as the light emission unit 20 having such a configuration, the light emission unit 20 including the one or the plurality of the light emission elements that emit light having the emission peak wavelength within the range from 430 nm to 494 nm and the wavelength conversion member 26 that includes a YAG phosphor. Furthermore, the light emission module 1 includes the light emission unit 20 including the one or the plurality of the light emission devices 21 that emit the light having the emission peak wavelength within the range from 430 nm to 494 nm and the wavelength conversion member 26 that includes the YAG phosphor.

Furthermore, for example, the light emission module 1 illustrated in the drawings includes, as the light emission unit 20 having such a configuration, the light emission unit 20 including the one or the plurality of the light emission elements that emit the light having the emission peak wavelength within the range from 430 nm to 494 nm and the wavelength conversion member 26 that includes an LAG phosphor. Furthermore, the light emission module 1 includes the light emission unit 20 including the one or the plurality of the light emission devices 21 that emit the light having the emission peak wavelength within the range from 430 nm to 494 nm and the wavelength conversion member 26 that includes the LAG phosphor.

Also, in the example of the light emission module 1 illustrated in the drawings, the plurality of light emission units 20 include a light emission unit 20 that emits only light from the one or the plurality of the light emission devices 21. In the light emission unit 20 having such a configuration, the light emitted from the one or the plurality of the light emission devices 21 becomes the light of the specific wavelength range emitted from the light emission unit 20.

For example, the light emission module 1 illustrated in the drawings includes, as the light emission unit 20 having such a configuration, the light emission unit 20 including the one or the plurality of the light emission elements that emit light having the emission peak wavelength within the range from 365 nm to 430 nm. Furthermore, the light emission module 1 includes the light emission unit 20 including the one or the plurality of the light emission devices 21 that emit the light having the emission peak wavelength within the range from 365 nm to 430 nm. Note that a component corresponding to the wavelength conversion member 26 is not included therein.

For example, when a wavelength conversion member such as phosphor is used for generating the light emitted from the light emission device 21, this wavelength conversion member is not considered to be a component corresponding to the wavelength conversion member 26. In other words, even when the light emission device 21 includes a wavelength conversion member as a component, it does not mean that the component corresponding to the wavelength conversion member 26 is included.

Furthermore, when the light emission module 1 includes the plurality of light emission units 20, the light of the specific wavelength range emitted by each of the plurality of light emission units 20 has mutually different peak wavelength. For example, when the plurality of light emission units 20 include two of the light emission units 20 (a first light emission unit 20 and a second light emission unit 20), the peak wavelength of light (first light) emitted from the first light emission unit 20 and the peak wavelength of light (second light) emitted from the second light emission unit 20 are different from each other.

Note that when the light emission module 1 includes the plurality of light emission units 20, the plurality of light emission units 20 may include two or more of the light emission units 20 that emit light of the same peak wavelength. Furthermore, the plurality of light emission units 20 may include two or more of the light emission units 20 that emit light of the same wavelength range. Furthermore, the plurality of light emission units 20 may include two or more of the light emission units 20 that emit light of the same specific wavelength range.

For example, the light emission module 1 illustrated in the drawings includes three of the light emission units 20 that emit light having mutually different peak wavelengths. Furthermore, two of the light emission units 20 share the single wavelength conversion member 26. The wavelength conversion member 26 is provided with two wavelength conversion regions in which the light is converted to mutually different wavelengths. Each of the two light emission units 20 causes the light from the light emission devices 21 to be incident on the mutually different wavelength conversion regions.

In the wavelength conversion member 26 shared by the two light emission units 20, the wavelength conversion portion 261 is provided from a position on which the light emitted from the light emission device 21 of one of the two light emission units 20 is incident to a position on which the light emitted from the light emission device 21 of the other of the two light emission units 20 is incident.

Furthermore, in a top view, the conversion control portion 262 and the protection member 27 are disposed between a straight line (i) and a straight line (ii), the straight line (i) is that passes over the position at which the light emitted from the light emission device 21 of the one of the two light emission units 20 is incident on the wavelength conversion portion 261 and that extends in a direction perpendicular to a light incident surface of the wavelength conversion portion 261 (a first direction), and the straight line (ii) is that passes over the position at which the light emitted from the light emission device 21 of the other of the two light emission units 20 is incident on the wavelength conversion portion 261 and that extends in the first direction.

In the example of the light emission module 1 illustrated in the drawings, in the light emission unit 20 including the wavelength conversion member 26, light emitted from the plurality of light emission portions 22 and condensed by the condensing lens (the optical member 24) are incident on the wavelength conversion portion 261. The protection member 27 is disposed at a position closer to the conversion control portion 262 than a position on the optical path of light that is emitted from the light emission portion 22 closest to the conversion control portion 262, exits from the condensing lens, and is incident on the wavelength conversion portion 261. In this way, it is possible to hinder an occurrence that the protection member 27 obstructs the optical path.

Furthermore, the protection member 27 includes a protection portion 272 that, in a top view, is positioned away from the conversion control portion 262 in a direction parallel to the light incident surface of the wavelength conversion portion 261 (a second direction) as approaching from the condensing lens toward the wavelength conversion portion 261.

In a top view, an angle formed by this second direction and the protection portion 272 is equal to or smaller than an angle formed by this second direction and a direction in which the light emitted from the light emission portion 22 closest to the conversion control portion 262 travels from the condensing lens to the wavelength conversion portion 261. Note that both the angles are acute angles. Due to the protection portion 272 having such a configuration, it is possible to hinder the wiring connected to the conversion control portion 262 from obstructing the optical path.

Furthermore, a difference between the two angles is preferably one degree or more and 25 degrees or less. Due to the protection portion 272 having such a configuration, a distance between the light emitted from the light emission portion 22 and the protection portion 272 gradually increases as approaching from the condensing lens to the wavelength conversion portion 261. Thus, light interference by the protection portion 272 can be avoided. Furthermore, it is possible to secure a sufficient region for protecting the wiring.

The wiring connected to the conversion control portion 262 is connected to the conversion control portion 262, extends toward the connection hole 15 therefrom, and is pulled out to the outside of the housing 10. In such a case, the wiring extending from the conversion control portion 262 toward the connection hole 15 passes through the protection region (the region illustrated with hatching in FIG. 8) provided between the conversion control portion 262 and the protection member 27 in a top view. Furthermore, the protection member 27 protects the wiring up to a sufficient height using the protection portion 272 (see FIG. 9). As a result, it is possible to extend the wiring toward the connection hole 15 with less occurrence of obstructing the light. As a result, the wavelength conversion member 26 can receive the power supply from the external power source while hindering the wiring from obstructing the light.

In the light emission unit 20 including the light emission device 21 that includes the plurality of light emission portions 22, the condensing lens (the optical member 24), the wavelength conversion member 26, and the collimating lens (the optical member 28), the wavelength conversion member 26 is disposed between the condensing lens and the collimating lens. Furthermore, the wavelength conversion member 26 is disposed closer to the collimating lens than to the condensing lens. Note that the wavelength conversion member 26 is preferably disposed in the vicinity of the collimating lens. Because the wavelength-converted light is emitted from the wavelength conversion member 26 over a wide angle range, collimated light having a small spot diameter can be obtained by disposing the wavelength conversion member 26 close to the collimating lens. As a result, when collimating the light having the same quantity of light, it is possible to design the area of the lens surface of the collimating lens to be smaller.

The single light emission unit 20 and the single optical member 30 correspond and are disposed on the arrangement region 110 of the housing 10. In the light emission module 1, the number of optical members 30 disposed therein is equal to or greater than the number of light emission units 20 disposed therein. The one or the plurality of the light emission units 20 emit the light in the direction toward the second lateral surface. Thus, each of the one or the plurality of the optical members 30 is disposed at a position closer to the second lateral surface than to the corresponding light emission unit 20.

The light emitted from the single light emission unit 20 is incident on the corresponding single optical member 30. Furthermore, the light of the specific wavelength range emitted from the single light emission unit 20 is incident on the corresponding single optical member 30. Furthermore, in the example of the light emission module 1 illustrated in the drawings, the light of the specific wavelength range emitted from the light emission unit 20 is incident on the corresponding optical member 30 in a state of being collimated light.

The single optical member 30 reflects the light of the specific wavelength range emitted from the corresponding single light emission unit 20 in a direction toward the second lateral surface. The reflected light travels in a direction toward one of the two first lateral surfaces of the housing 10. Furthermore, the single optical member 30 transmits a portion of the light of this specific wavelength range. The transmitted light travels in a direction toward the second lateral surface of the housing 10.

The light emission module 1 includes the optical member 30 having high reflectance over the entire specific wavelength range with respect to the light of the specific wavelength range emitted from the corresponding single light emission unit 20. In this case, ratios of reflection and transmission with respect to the light of the specific wavelength range are the reflectance and the transmittance, respectively.

When the wavelength range of the spectrum of light emitted from the light emission unit 20 is narrow, it is possible to generate reflected light and transmitted light using the optical member 30 having such a characteristic. In the example of the light emission module 1 illustrated in the drawings, the optical member 30 having such a characteristic is applied to the optical member 30 corresponding to the light emission unit 20 that does not include the wavelength conversion member 26, namely, the light emission unit 20 that emits only the light from the one or the plurality of the light emission devices 21. For example, 98% or more of the light of the specific wavelength range from the light emission unit 20 is reflected by the corresponding optical member 30.

Furthermore, the light emission module 1 includes the optical member 30 having high reflectance in a part of the specific wavelength range with respect to the light of the specific wavelength range from the corresponding single light emission unit 20 and having high transmittance in another part thereof. In this case, ratios of the reflected light and the transmitted light with respect to the quantity of light over the entire specific wavelength range are affected by the ratios of the quantity of light in the wavelength range where the optical member 30 has high reflectance and the quantity of light in the wavelength range where the optical member 30 has high transmittance.

When the wavelength range of the spectrum of light emitted from the light emission unit 20 is wide, it is possible to generate the reflected light and the transmitted light in this manner. In the example of the light emission module 1 illustrated in the drawings, the optical member 30 having such a characteristic is applied to the optical member 30 corresponding to the light emission unit 20 that includes the wavelength conversion member 26, namely, the light emission unit 20 that emits the light wavelength-converted by the wavelength conversion member 26.

The plurality of window portions 13 included in the housing 10 of the light emission module 1 include two of the window portions 13 that respectively extract two lights, which is generated as a result of the light emitted from the light emission unit 20 being split via the optical member 30, traveling in mutually different directions.

In the light emission module 1, the light reflected by the one or the plurality of the optical members 30 is emitted from one of the plurality of window portions 13 of the housing 10 to the outside of the housing 10. In the example of the light emission module 1 illustrated in the drawings, the light reflected by the optical member 30 exits from the window portion 13 provided at one of the two first lateral surfaces of the housing 10.

Furthermore, in the light emission module 1, the light transmitted by the one or the plurality of the optical members 30 is emitted from one of the plurality of window portions 13 of the housing 10 to the outside of the housing 10. In the example of the light emission module 1 illustrated in the drawings, the light transmitted by the optical member 30 exits from the window portion 13 provided at the second lateral surface of the housing 10.

When the light emission module 1 includes the plurality of light emission units 20 and the plurality of optical members 30 corresponding to the plurality of light emission units 20, respectively, a plurality of lights emitted from the plurality of light emission units 20 travel in a predetermined direction (a third direction) via the corresponding optical members 30, respectively, and are emitted from the single window portion 13 (a first window portion) of the housing 10 to the outside of the housing 10.

Thus, the plurality of window portions 13 include the first window portion that extracts the light (the first light and the second light) emitted from two of the light emission units 20 (the first light emission unit and the second light emission unit), respectively. Furthermore, the plurality of window portions 13 include the first window portion that extracts the first light and the second light traveling in the predetermined direction via two of the optical members 30 (a first optical member and a second optical member) corresponding to the first light emission unit and the second light emission unit.

Furthermore, the plurality of lights emitted from the corresponding plurality of light emission units 20 travel in a predetermined direction different from the third direction via the corresponding optical members 30 and are respectively emitted from the mutually different window portions 13 of the housing 10 to the outside of the housing 10.

Thus, the plurality of window portions 13 include two of the window portions 13 (second window portions) that are two of the window portions 13 different from the first window portion, and one of the two window portions 13 extracts the first light while the other of the two window portions 13 extracts the second light. Furthermore, the plurality of window portions 13 include two of the second window portions. One of the two second window portions extracts the first light traveling in a predetermined direction different from the third direction via the first optical member corresponding to the first light emission unit, and the other of the two second window portions extracts the second light traveling in a predetermined direction different from the third direction via the second optical member corresponding to the second light emission unit.

In the example of the light emission module 1 illustrated in the drawings, the light emitted from each of the three light emission units 20 is reflected via the corresponding optical member 30 and extracted from the first window portion. Furthermore, the lights emitted from the corresponding three light emission units 20 are transmitted via the corresponding optical members 30 and are respectively extracted from the mutually different window portions 13.

The plurality of lights emitted from the plurality of light emission units 20 and exiting from the first window portion to the outside are turned into synthesized light and emitted from the first window portion to the outside of the housing 10. Furthermore, the plurality of lights emitted from the plurality of light emission units 20 are turned into synthesized light passing over the same axis and extracted from the first window portion. In this way, the synthesized light emitted from the plurality of light emission units 20 and the light emitted from the single light emission unit 20 can be separately extracted from the different window portions 13.

In this manner, by providing the window portions 13 from which the respective lights are emitted, separately from the window portion 13 from which the synthesized light is emitted, the synthesized light and the respective lights can be easily handled separately outside the light emission module 1. Thus, the light controlled in the light emission module 1 can be easily utilized from the outside of the light emission module 1.

The light of the specific wavelength range emitted from the light emission unit 20 positioned further from the first window portion is reflected by the corresponding optical member 30 and is transmitted through the optical member 30 corresponding to the light emission unit 20 positioned closer to the first window portion. The synthesized light can be generated in this manner.

The first window portion from which the plurality of lights emitted from the plurality of light emission units 20 are collectively extracted and two or more of the second window portions from which the plurality of lights emitted from the plurality of light emission units 20 are respectively separately extracted are provided at different surfaces of the housing 10.

In the light emission module 1, the first window portion is provided at the first surface of the housing 10, and two or more of the second window portions are provided at the second surface of the housing 10. In the example of the light emission module 1 illustrated in the drawings, the first window portion is provided at one of the two first lateral surfaces of the housing 10, and three of the second window portions are provided at the second lateral surface of the housing 10. By extracting the light from the different surfaces, it is possible to prevent the synthesized light and the light emitted from the single light emission unit 20 from interfering with each other.

The light emission module 1 includes the optical member 30 having high reflectance over the entire specific wavelength range of the light in the specific wavelength range emitted from the corresponding light emission unit 20, and the optical member 30 having high reflectance in a part of the specific wavelength range of the light in the specific wavelength range emitted from the corresponding single light emission unit 20 and having high transmittance in another part thereof.

In this way, even when the light emission unit 20 that emits light having a narrow specific wavelength range and the light emission unit 20 that emits light having a wide specific wavelength range are both provided, it is possible to split the light into the reflected light and the transmitted light by employing the optical members 30 having different characteristics depending on the size of the wavelength range.

Among the light incident on the second window portion, light passing through the filter 144 exits from the emission port 14 to the outside of the light emission module 1. The filter 144 at the second window portion only allows the light of the specific wavelength range to pass through, among the light emitted from the light emission units 20 corresponding to this second window portion. Furthermore, only a portion of the light of the specific wavelength range is allowed to pass through. In this manner, by the second window portion including the filter 144, light of a desired wavelength range, among the light emitted from the light emission unit 20, can be extracted from the second window portion.

For example, the light emitted from the light emission unit 20 including the wavelength conversion member 26 includes the light emitted from the light emission device and the light wavelength-converted by the wavelength conversion member 26. In such a case, the specific wavelength range is a wavelength range of the light wavelength-converted by the wavelength conversion member 26, and when the light emitted from the light emission element is not included in this wavelength range, the light emitted from the light emission element is not included in the light of the specific wavelength range. Thus, the light emitted from the light emission element does not pass through the filter 144 and is not emitted from the second window portion.

Second Embodiment

Figure 13:
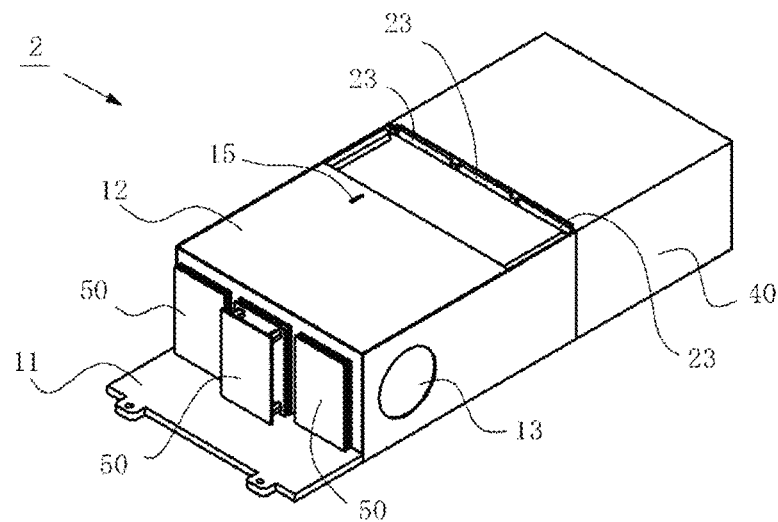
FIG. 13 is a perspective view of a light emission module according to a second embodiment.
Figure 14:
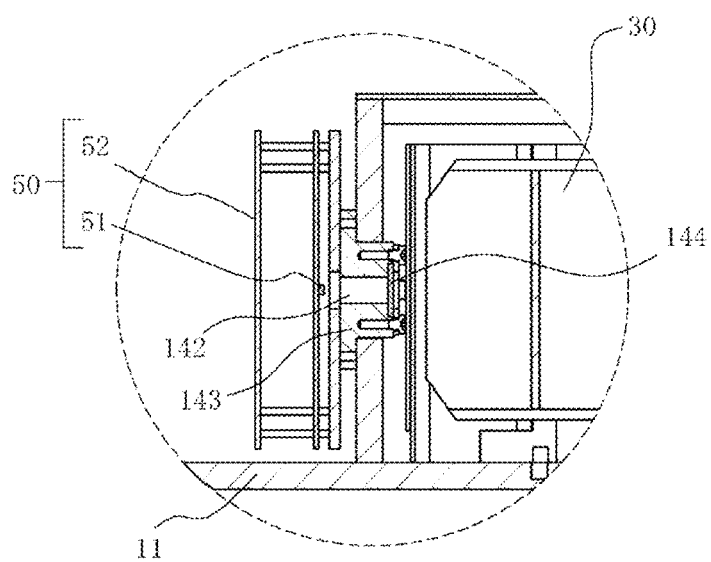
FIG. 14 is a cross-sectional view for illustrating a structure of a light detection member and a window portion in the light emission module according to the second embodiment.

Next, a light emission module 2 according to a second embodiment will be described. FIGS. 13 and 14 are drawings for illustrating an exemplary form of the light emission module 2. FIG. 13 is a perspective view of the light emission module 2. FIG. 14 is a cross-sectional view for illustrating a structure of a light detection member 50 and the window portion 13 of the light emission module 2. Note that FIG. 14 is an enlarged view of the same range as the range encircled by the broken line in FIG. 10.

In the second embodiment, an example of how the light extracted from the plurality of window portions 13 is utilized in a light emission module including the plurality of window portions 13 will be described. In other words, a form in which each light controlled in the light emission module 1 is utilized outside the light emission module 1 will be described. The light emission module 2 includes one or a plurality of the light detection members 50, and the light detection member 50 detects light exiting from one or a plurality of the window portions 13.

The light emission module 2 according to the second embodiment differs from the light emission module of the embodiment described above in that the light emission module 2 includes the light detection member 50. Otherwise, the same or a similar configuration as that of the light emission module according to the embodiment described above can be employed.

Light Detection Member 50

The light detection member 50 includes a light receiving element 51. Furthermore, the light detection member 50 includes a connection member 52. The light receiving element 51 converts irradiated light into an electrical signal. The strength of the converted electrical signal corresponds to the intensity of the irradiated light. For example, a photodiode can be employed as the light receiving element 51.

The connection member 52 fixes the light receiving element 51 at a predetermined position. The connection member 52 includes a mounting surface on which the light receiving element 51 is mounted. The light receiving element 51 is mounted on the mounting surface of the connection member 52.

Light Emission Module 2

In the light emission module 2, the light detection member 50 is disposed opposite to the light emission unit 20 with the surface of the housing 10 in which the window portion 13 is provided as a boundary. The window portion 13 through which this light passes is provided between the light detection member 50 and the light emission unit 20 that emits light to be detected by this light detection member 50. In the example of the light emission module 2 illustrated in the drawings, the second lateral surface is disposed between the light detection member 50 and the light emission unit 20.

In other words, after manufacturing the light emission module 1 according to the first embodiment, by attaching the light detection member 50 thereto, the light emission module 2 according to the second embodiment can be manufactured. Note that the component to be retrofitted need not be limited to the light detection member 50.

Furthermore, for example, in a case in which the light emitted through the window portion 13 to the outside of the housing 10 is not utilized, the light can be shielded by a light shielding plate instead of the light detection member 50. In this way, in accordance with how the light exiting from the window portion 13 is utilized or is not utilized, it is possible to add a component and implement the light emission module 2 according to the utilization method.

This can be considered as a light emission module that is easy to handle from a viewpoint that a light emission module at which the light shielding plate is mounted, the light emission module 2, or the like can be easily implemented from the light emission module 1. Furthermore, the light emission module 2 can be considered to be a light emission module that is easy to handle from a viewpoint that it has a light detection function and can easily perform output control of each light.

The connection member 52 of the light detection member 50 is connected to the housing 10. Furthermore, the connection member 52 is connected to the lid member 12 of the housing 10. Furthermore, the connection member 52 is connected to the window portion 13 of the housing 10. As a result of the connection member 52 being directly connected to the window portion 13, the positional accuracy of the connection member 52 with respect to the window portion 13 can be increased. Note that the connection member 52 may be connected to another position of the housing 10, such as the second upper surface, for example.

In the light emission module 2, the light receiving elements 51 included in the corresponding plurality of light detection members 50 receive the lights extracted from the mutually different window portions 13, respectively. Furthermore, the plurality of light detection members 50 are connected to the mutually different window portions 13. In the example of the light emission module 2 illustrated in the drawings, the light detection members 50 are connected to the corresponding plurality of second window portions. In this way, the light respectively emitted from the plurality of light emission units 20 can be detected separately.

The light receiving element 51 of the light detection member 50 is disposed to face the emission port 14 of the window portion 13. The light receiving element 51 is irradiated with the light emitted from the emission port 14 of the window portion 13. In the example of the light emission module 1 illustrated in the drawings, the area of a light receiving surface of the light receiving element 51 is smaller than the area of the emission port 14 of the window portion 13.

Note that the area of the light receiving surface of the light receiving element 51 may be the same as the area of the emission port 14 of the window portion 13 or may be greater than the area of the emission port 14 of the window portion 13. The greater the area of the light receiving surface, the wider the range over which the light receiving element 51 can receive the light. On the other hand, the smaller the area of light receiving surface, the faster a response speed the light receiving element 51 can achieve. In the example of the light emission module 1 illustrated in the drawings, the response speed is prioritized over the quantity of received light.

Third Embodiment

Figure 15:
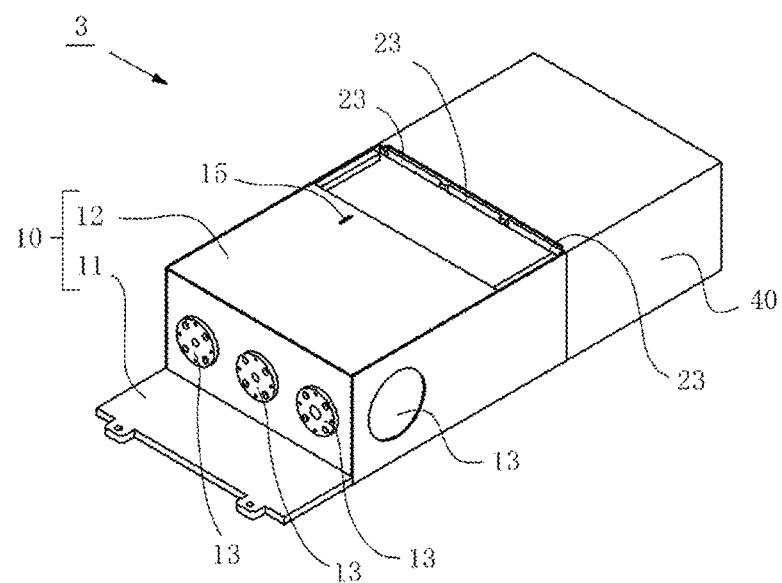
FIG. 15 is a perspective view of a light emission module according to a third embodiment.
Figure 16:
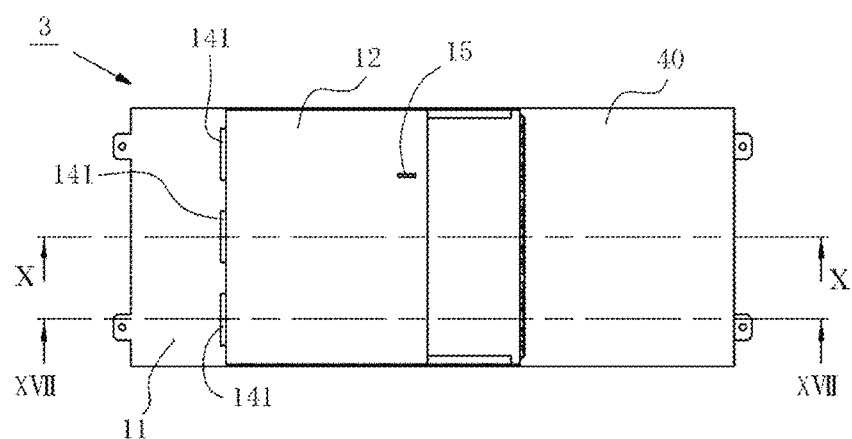
FIG. 16 is a top view of the light emission module according to the third embodiment.
Figure 17:
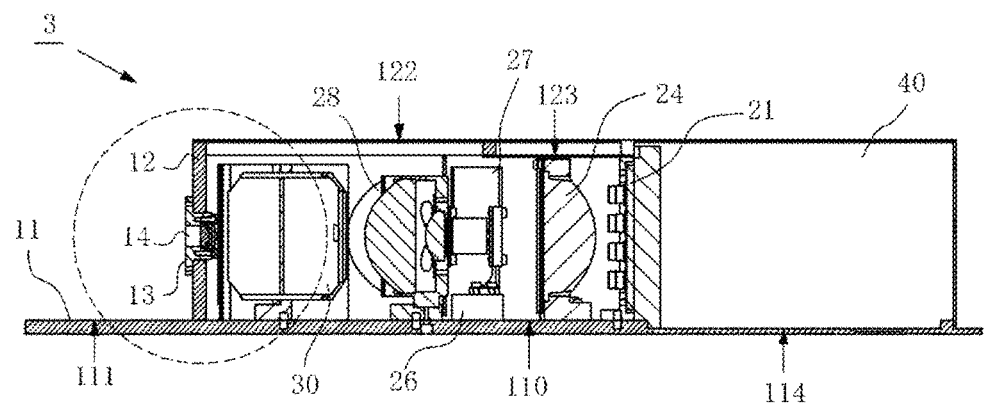
FIG. 17 is a cross-sectional view of the light emission module taken along a cross-sectional line XVII-XVII in FIG. 16.
Figure 18:
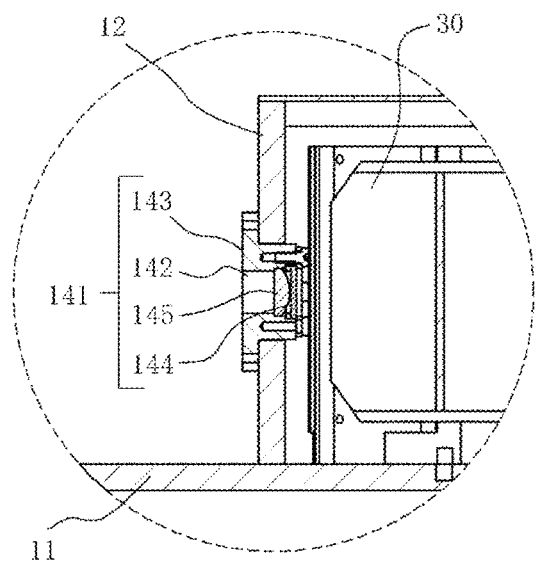
FIG. 18 is an enlarged view of a portion encircled by a broken line in the cross-sectional view of FIG. 17.
Figure 19:
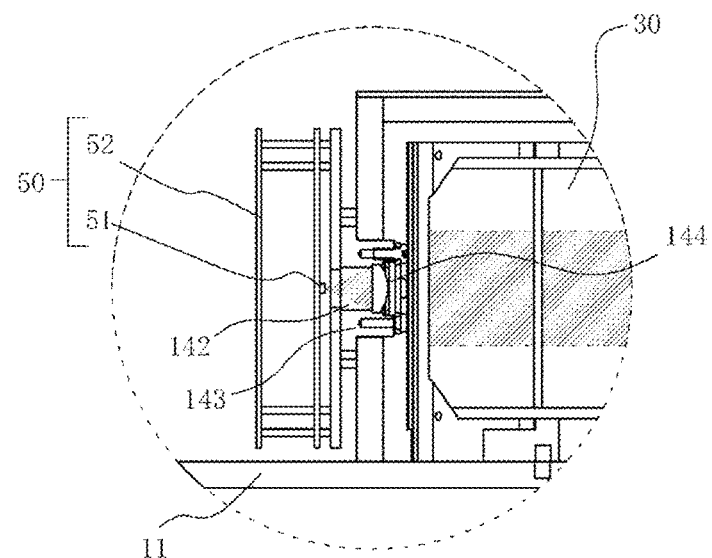
FIG. 19 is an enlarged view of a portion corresponding to FIG. 18 in a state in which the light emission module according to the third embodiment includes the light detection member.

Next, a light emission module 3 according to a third embodiment will be described. FIGS. 15 to 19 are drawings for illustrating an exemplary form of the light emission module 3. FIG. 15 is a perspective view of the light emission module 3. FIG. 16 is a top view of the light emission module 3. FIG. 17 is a cross-sectional view taken along a cross-sectional line XVII-XVII in FIG. 16. FIG. 18 is an enlarged view of a portion, of the window portion 13, encircled by a broken line in the cross-sectional view of FIG. 17. FIG. 19 illustrates a cross-sectional view of a state in which the light detection member 50 is connected to the window portion 13, as in the light emission module 2 according to the second embodiment.

Note that the cross-sectional view taken along the line X-X in FIG. 16 is the same as that of FIG. 10. Furthermore, regions illustrated with hatching in FIG. 19 indicate a region through which the light emitted from the light emission unit 20 passes. Note that in FIG. 19, hatching for the cross-section of each of the components is omitted.

The light emission module 3 differs from the light emission modules of the embodiments described above in that the light guide unit 141 including a lens member 145 is provided in the housing 10. Furthermore, the light emission module 3 differs from the light emission modules of the embodiments described above in that two or more of the light guide units 141 having mutually different structures are provided in the housing 10. Otherwise, the configuration same as or similar to those of the light emission modules according to the embodiments described above can be employed.

The light emission module 3 includes one or a plurality of the light guide units 141 including the lens member(s) 145. Furthermore, the plurality of light guide units 141 includes the light guide unit 141 that includes the lens member 145 (a first light guide unit) and the light guide unit 141 that does not include the lens member 145 (a second light guide unit). Note that the light emission module 3 need not necessarily include the second light guide unit. For example, all of the light guide units 141 may be the first light guide units.

First Light Guide Unit

The lens member 145 included in the first light guide unit is, for example, a condensing lens that condenses the light incident on the window portion 13. Note that, depending on the purpose and the application, the condensing lens need not necessarily be employed, and, for example, a diffusion lens or a collimating lens may be employed instead.

In the first light guide unit, the lens member 145 is provided proximate to the incident surface from which the light enters the window portion 13. Furthermore, in the first light guide unit, the filter 144 is connected proximate to the incident surface of the light guide member 142, which guides the light to the emission port 14, and the lens member 145 is connected proximate to the incident surface of the filter 144. The light that has passed through the lens member 145 passes through the light guide path formed by the light guide member 142 and is condensed toward the emission port 14. Furthermore, a focal point at which the light having passed through the lens member 145 is condensed is positioned on the emission port 14, or outside the housing 10.

Second Light Guide Unit

The light guide unit 141 described in the light emission module 1 according to the first embodiment can be employed as the second light guide unit.

When the first light guide unit and the second light guide unit are compared with each other, the lens surface of the lens member 145 of the first light guide unit is larger than the incident surface of the second light guide unit. The area of the emission port 14 of the first light guide unit is larger than that of the second light guide unit. Furthermore, the area of the light incident surface in the window portion 13 of the first light guide unit is larger than that of the second light guide unit. Furthermore, the light guide path formed by the light guide member 142 of the first light guide unit is larger than that of the second light guide unit. The first light guide unit can secure a wider region through which the light passes than the second light guide unit.

Light Emission Module 3

In the light emission module 3, the first light guide unit is provided at the window portion 13 of the second lateral surface. Furthermore, the plurality of window portions 13 provided in the second lateral surface include the window portion 13 provided with the first light guide unit. Furthermore, the plurality of window portions 13 provided in the second lateral surface include the window portion 13 provided with the second light guide unit.

Furthermore, in the example of the light emission module 3 illustrated in the drawings, the first light guide unit is provided in the window portion 13 that extracts the light transmitted through the optical member 30 having high reflectance over the entire specific wavelength range, with respect to the light of the specific wavelength range emitted from the light emission unit 20.

Furthermore, in the example of the light emission module 3 illustrated in the drawings, the second light guide unit is provided in the window portion 13 that extracts the light transmitted through the optical member 30 having high reflectance in a part of the specific wavelength range and having high transmittance in another part thereof, with respect to the light of the specific wavelength range emitted from the light emission unit 20.

Furthermore, in the example of the light emission module 3 illustrated in the drawings, the first light guide unit is provided for the window portion 13 that extracts the light emitted from the one or the plurality of the light emission elements, and the second light guide unit is provided for the window portion 13 that extracts the light wavelength-converted by the wavelength conversion member 26. Thus, one of the first light guide units and two of the second light guide units are provided in the housing 10.

For example, in a case in which the light receiving surface of the light receiving element 51 is small relative to the emission port 14 of the window portion 13, as in the light emission module 2 of the second embodiment, by providing the first light guide unit and causing the light to be condensed at the light receiving surface, the quantity of light irradiated onto the light receiving surface can be increased (see FIG. 19). Furthermore, a greater improvement can be expected for the light reception sensitivity of the light receiving element 51 if the second light guide unit is provided in the second window portion of the light emission unit 20, among the plurality of light emission units 20, that extracts a smaller quantity of light.

In the example of the light emission module 3 illustrated in the drawings, the focal point of the light condensed by the lens member 145 of the first light guide unit is set outside the housing 10. For example, as illustrated in the enlarged view, when the light detection member 50 is provided outside the housing 10, the focal point is preferably set at the light receiving surface of the light receiving element 51 of the light detection member 50. In this way, the collimated light incident on the window portion 13 can be effectively received by the light receiving element 51.

Fourth Embodiment

Figure 20:
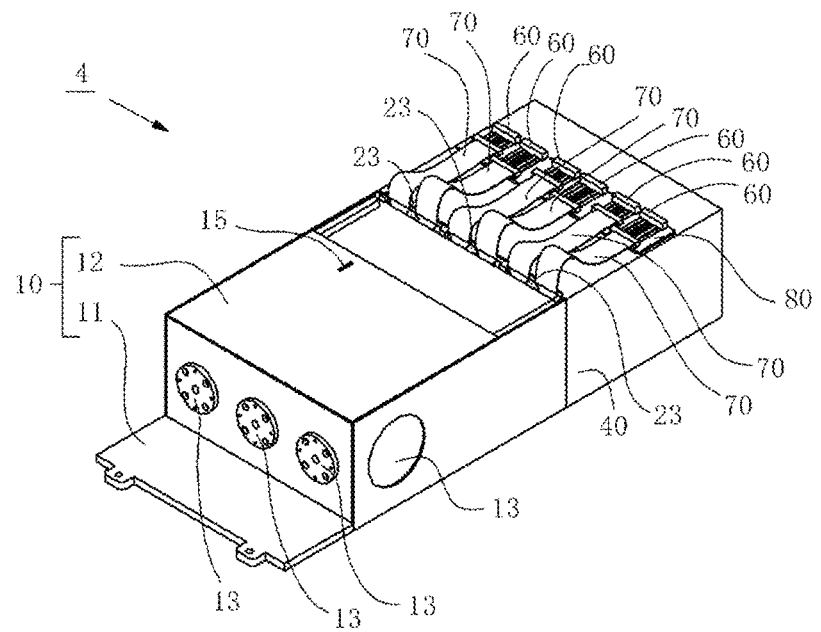
FIG. 20 is a perspective view of a light emission module according to a fourth embodiment.
Figure 21:
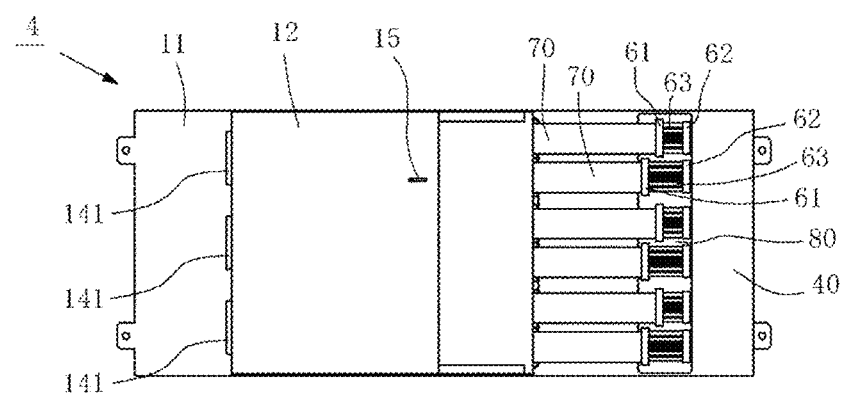
FIG. 21 is a top view of the light emission module according to the fourth embodiment.
Figure 22:
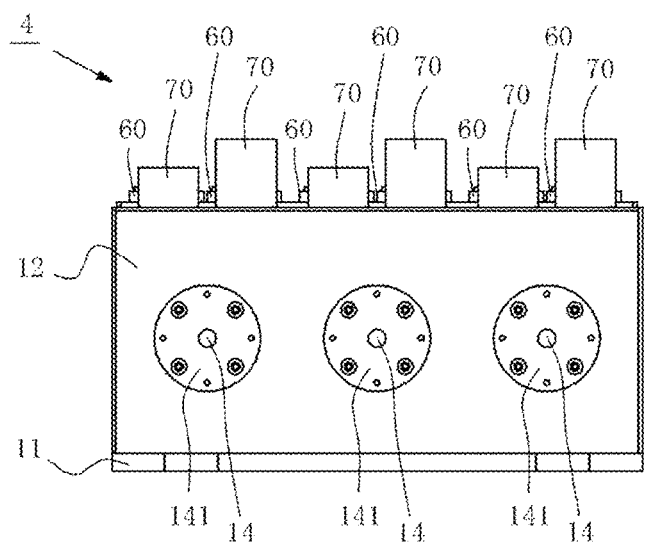
FIG. 22 is a lateral view of the light emission module according to the fourth embodiment.

Next, a light emission module 4 according to a fourth embodiment will be described. FIGS. 20 to 22 are drawings for illustrating an exemplary form of the light emission module 4. FIG. 20 is a perspective view of the light emission module 4. FIG. 21 is a top view of the light emission module 4. FIG. 22 is a lateral view of the light emission module 4.

The light emission module 4 differs from the light emission modules of the embodiments described above in that the light emission module 4 includes a plurality of wirings 70, a plurality of connectors 60, and a base plate 80. Otherwise, the configuration same as or similar to those of the light emission modules according to the embodiments described above can be employed.

Wiring 70

For example, a flexible printed circuits (FPC) can be employed as the wiring 70. Furthermore, the wiring 70 has a film shape and is elongated and also flexible. Thus, even when it is deformed into a bent state, an electrical connection can be maintained. Furthermore, the wiring 70 includes a terminal at a tip portion thereof.

Connector 60

The connector 60 includes a first connector portion 61 and a second connector portion 62, each of which is connected to the terminal. The first connector portion 61 and the second connector portion 62 face each other. Furthermore, the first connector portion 61 and the second connector portion 62 are electrically connected to each other by a conduction portion 63.

Furthermore, in a plan view parallel to a mounting surface at which the connectors 60 are mounted, the first connector portions 61 are disposed parallel to a direction (a fifth direction) perpendicular to a direction (a fourth direction) in which the conduction portion 63 connects the first connector portion 61 and the second connector portion 62 facing each other. Furthermore, the second connector portion 62 are disposed parallel to the fifth direction.

Furthermore, in the plan view parallel to the mounting surface at which the connectors 60 are mounted, the first connector portion 61 and the second connector portion 62 each have a rectangular shape that is elongated in the fifth direction. Furthermore, the length of the first connector portion 61 in the fifth direction is greater than the length of the second connector portion 62 in the fifth direction.

Furthermore, the plurality of connectors 60 include two of the connectors 60 with the conduction portions 63 each having a length different from each other and each connecting the corresponding first connector portion and the corresponding second connector portion. A difference between the lengths of the conduction portions 63 of the two connectors 60 is greater than the length of the first connector portion 61 in the fourth direction.

Base Plate 80

The base plate 80 has a flat plate shape. The base plate 80 is formed of a flat plate of epoxy glass, for example. Furthermore, it may also be formed of a flat plate of aluminum.

Light Emission Module 4

In the light emission module 4, the base plate 80 is disposed on the heat sink 40. In a top view, the base plate 80 is disposed to face the lateral surface of the heat sink 40 on which the light emission devices 21 are mounted. In a top view, a straight line passing through the lateral surface of the heat sink 40 and the side of the base plate 80 facing this lateral surface are parallel to each other.

In a top view, a distance between the lateral surface of the heat sink 40 and the base plate 80 is equal to or greater than half the length of the shortest wiring 70 of the plurality of wirings 70, equal to or greater than half the length of the longest wiring 70 of the plurality of wirings 70, and shorter than the shortest wiring 70 of the plurality of wirings 70. By disposing the base plate 80 with this gap, the plurality of wirings 70 can be connected in a stable manner.

The plurality of connectors 60 are disposed proximate to the upper surface of the light emission module 4. Furthermore, the plurality of connectors 60 are disposed on the heat sink 40. Furthermore, the plurality of connectors 60 are mounted on the base plate 80. Note that the plurality of connectors 60 may be mounted on the upper surface of the heat sink 40 without including the base plate 80. In this case, the light emission module 4 need not necessarily include the base plate 80.

In each of the plurality of connectors 60, among the first connector portion 61 and the second connector portion 62, the first connector portion 61 is disposed to be closer to the light emission device 21 than the second connector portion 62. The first connector portion 61 includes a connection port, which faces in a direction toward the second lateral surface, to be connected to the terminal, and the second connector portion 62 includes a connection port, which faces in the direction opposite to the second lateral surface, to be connected to the terminal.

The plurality of connectors 60 are disposed next to each other on the heat sink 40. A single connector 60 corresponds to a single light emission device 21, and the plurality of connectors 60 are disposed next to each other so that the first connector portion 61 of the single connector 60 faces the connection portion 23 of the single light emission device 21.

Among the plurality of connectors 60 disposed next to each other, the adjacent connectors 60 include the conduction portions 63 having different lengths from each other. Furthermore, the adjacent connectors 60 are disposed so that the first connector portions 61 of the adjacent connectors 60 are offset from each other in the fourth direction. In other words, the first connector portions 61 of the adjacent connectors 60 are not disposed on a single straight line parallel to the fifth direction.

Thus, a distance between the first connector portion 61 of one of the adjacent connectors 60 and the connection portion 23 of the light emission device 21 corresponding to the one of the adjacent connectors 60 is greater than a distance between the first connector portion 61 of the other of the adjacent connectors 60 and the connection portion 23 of the light emission device 21 corresponding to the other of the adjacent connectors 60. Furthermore, a difference between those distances is at least greater than the length of the first connector portion 61 in the fourth direction.

On the other hand, the adjacent connectors 60 are disposed without causing the second connector portions 62 of the adjacent connectors 60 to be offset from each other in the fourth direction. In other words, the second connector portions 62 of the adjacent connectors 60 are disposed on a single straight line parallel to the fifth direction.

Thus, a distance between the second connector portion 62 of one of the adjacent connectors 60 and the connection portion 23 of the light emission device 21 corresponding to the one of the adjacent connectors 60 is equal to a distance between the second connector portion 62 of the other of the adjacent connectors 60 and the connection portion 23 of the light emission device 21 corresponding to the other of the adjacent connectors 60, or a difference between those distances is at least smaller than the length of the second connector portion 62 in the fourth direction.

Because the length of the first connector portion 61 in the fifth direction is longer than that of the second connector portion 62, by disposing them in the above-described manner, the plurality of connectors 60 can be disposed next to each other with shorter intervals. As a result, a region for disposing the plurality of connectors 60 can be reduced.

The interval between the adjacent connectors 60 is shorter than either half the length of the first connector portion 61 in the fifth direction and half the length of the second connector portion 62 in the fifth direction. Furthermore, the shorter the interval, the smaller the region for disposing the plurality of connectors 60.

The plurality of connectors 60 included in the light emission module 4 includes one or a plurality of first connectors and one or a plurality of second connectors. The number of first connectors and the number of second connectors are the same. For example, the light emission module 4 illustrated in the drawings includes six of the connectors 60 in total, which include three of the first connectors and three of the second connectors. Furthermore, the number of first connectors and the number of second connectors are the same as the number of light emission units 20.

The wiring 70 is connected to the corresponding light emission device 21 and connector 60. The plurality of light emission devices 21 and the corresponding plurality of connectors 60 are electrically connected to each other by the corresponding plurality of wirings 70. The terminal of the wiring 70 is connected to the first connector portion 61 of the connector 60. Furthermore, the wiring 70 is connected to the connection portion 23 of the light emission device 21. For example, the wiring 70 is connected to the first surface (the wiring mounting surface) of the connection portion 23.

The size of the light emission module 4 can be reduced by disposing the first connector portions 61 in the offset manner, and also, a light emission module is implemented to which an external terminal is easily connected by disposing the second connector portions 62 in the aligned manner. As a result, when a device provided with the light emission module 4 is manufactured, time and effort required for design can be reduced.

The light emission module 4 can be considered to be a light emission module that is easy to handle from a viewpoint that the connectors are provided and that electrical connection to each of the light emission devices 21 can be easily achieved by connecting the light emission devices 21 to the connectors.

Fifth Embodiment

Figure 23:
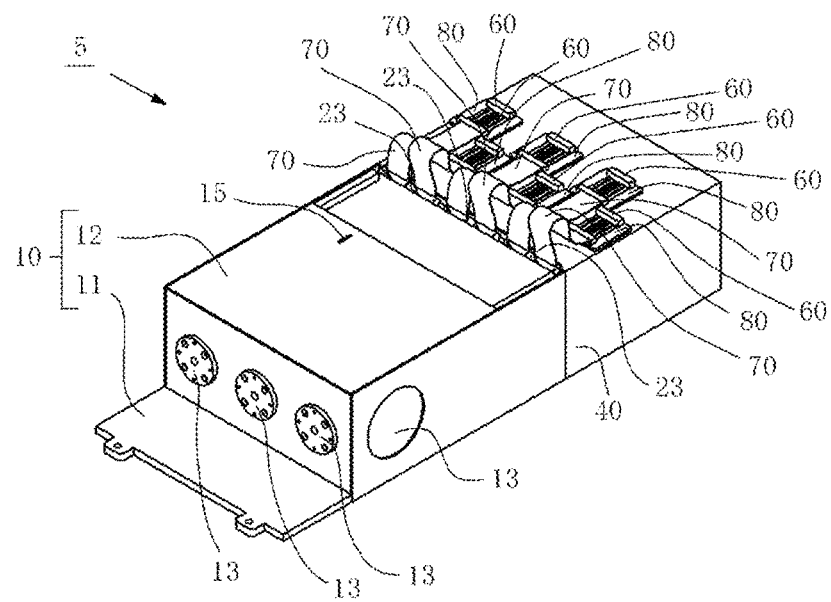
FIG. 23 is a perspective view of a light emission module according to a fifth embodiment.
Figure 24:
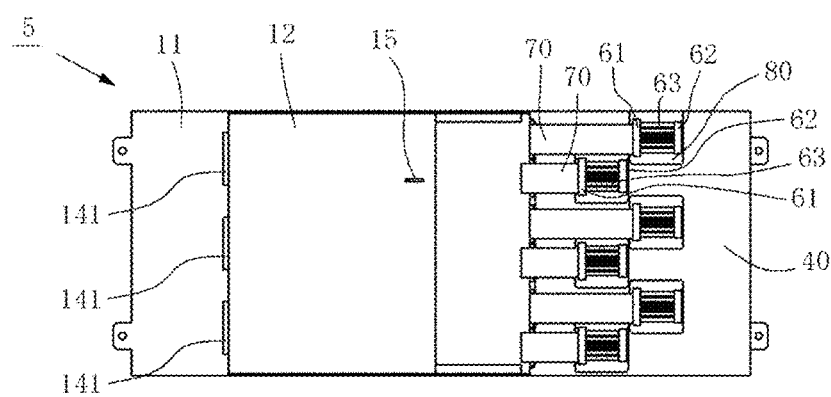
FIG. 24 is a top view of the light emission module according to the fifth embodiment.

Next, a light emission module 5 according to a fifth embodiment will be described. FIGS. 23 and 24 are drawings for illustrating an exemplary form of the light emission module 5. FIG. 23 is a perspective view of the light emission module 5. FIG. 24 is a top view of the light emission module 5.

The light emission module 5 according to the fifth embodiment is another example of the light emission module in which the region for disposing the plurality of connectors 60 can be reduced in the same manner as in the light emission module 4 according to the fourth embodiment. Furthermore, in the light emission module 5 according to the fifth embodiment, the light emission module 5 differs from the light emission module 4 according to the fourth embodiment in that the light emission module 5 is implemented using the plurality of connectors 60 each including the conduction portion 63 of the same length.

In the light emission module 5, in a top view, the plurality of connectors 60 are alternately disposed along with the fifth direction while being disposed in two regions divided by a single straight line as a boundary line extending in the fifth direction. Among the two regions, the connector 60 disposed in the region closer to the light emission device 21 is disposed so that the second connector portion 62 is close to the boundary line, and the connector 60 disposed in the region further away from the light emission device 21 is disposed so that the first connector portion 61 is close to the boundary line.

Furthermore, in the light emission module 5, the single base plate 80 is prepared for the single connector 60, and the same number of base plates 80 as the number of connectors 60 are disposed. Note that the plurality of connectors 60 may be disposed on the single base plate 80, and the connectors 60 may be mounted on the heat sink 40 without including the base plates 80.

In this way, by implementing the light emission module using the same connectors 60, common components can be used, and thus, the manufacturing process of the light emission module can be simplified.

Although the embodiments according to the present invention have been described above, the light emission device according to the present invention is not strictly limited to the light emission devices of the embodiments. In other words, the present invention can be achieved without being limited to the external shape or structure of the light emission device disclosed by each of the embodiments. Furthermore, the present invention may be applied without requiring all the components being sufficiently provided. For example, in a case in which some of the components of the light emission device disclosed by the embodiments are not stated in the scope of the claims, the degree of freedom in design by those skilled in the art such as substitutions, omissions, shape modifications, and material changes for those components is allowed, and then the invention stated in the scope of the claims being applied to those components is specified.

INDUSTRIAL APPLICABILITY

The light emission device described in each of the embodiments can be used in a light source of medical equipment such as an endoscope, a projector, lighting, a display, and the like.

REFERENCE SIGNS LIST 1, 2, 3, 4, 5 Light emission module
10 Housing
11 Base member
110 Arrangement region
112, 114 Upper surface
12 Lid portion
121, 123 Upper surface
13 Window portion
14 Emission port
140 Light-transmissive member
141 Light guide unit
142 Light guide member
143 Connection member
144 Filter
145 Lens member
15 Connection hole
20 Light emission unit
21 Light emission device
22 Light emission portion
23 Connection portion
24 Optical member (condensing lens)
25 Optical member (diffusion plate)
26 Wavelength conversion member (phosphor wheel)
261 Wavelength conversion portion
262 Conversion control portion
27 Protection member
271 Connection portion
272 Protection portion
28 Optical member (collimating lens)
30 Optical member (dichroic mirror)
40 Heat sink
50 Light detection member
51 Light receiving element
52 Connection member
60 Connector
61 First connector portion
62 Second connector portion
63 Conduction portion
70 Wiring (flexible circuit board)
80 Base plate

The invention claimed is:

1. A light emission module comprising:
a first light emission unit including a first light emission device and being configured to emit a first light, the first light emission device including
a plurality of first light emission portions where light from a plurality of first light emission elements is emitted, the first light emission portions each including a light emission surface,
a heat dissipation surface provided opposite to the light emission surface, and
a connection portion being positioned between the light emission surface and the heat dissipation surface, and including a wiring mounting surface where the light emission elements are electrically connected;
a first optical member configured to reflect the first light;
a housing including a base member where the first light emission unit and the first optical member are disposed and a lid member surrounding the light emission device surrounding the first light emission unit and the first optical member that are disposed on the base member;
a heat sink being connected to the heat dissipation surface and including a mounting surface where the first light emission device is mounted, wherein
the wiring mounting surface extends upward upper than a first upper surface of the housing, and a portion of the wiring mounting surface is exposed to the outside of the housing.

2. The light emission module according to claim 1, wherein
the housing includes the first upper surface and a second upper surface provided upper than the first upper surface, and
the wiring mounting surface is exposed upward upper than the first upper surface and does not extend upward upper than the second upper surface.

3. The light emission module according to claim 1, wherein
the heat sink includes an upper surface, and
the wiring mounting surface is exposed upward upper than the first upper surface and does not extend upward upper than the upper surface of the heat sink.

4. The light emission module according to claim 1, further comprising:
a plurality of connectors including at least one first connector portion and at least one second connector portion, and including at least one conduction portion configured to connect the first connector portion and the second connector portion; and
a plurality of wirings connected to the first connector portion of the connectors and to the connection portion of the first light emission device, wherein
in the connectors, the first connector portion is longer than the second connector portion in a direction perpendicular to a direction where the conduction portion connects the first connector portion and the second connector portion.

5. The light emission module according to claim 4, wherein
the connectors are disposed next to each other on the heat sink.

6. The light emission module according to claim 4, wherein
the connectors include a first connector and a second connector disposed adjacent to each other, and a length of the conduction portion of the first connector and a length of the conduction portion of the second connector are different to each other, and
a distance between the first connector portion of the first connector and the connection portion corresponding to the first connector is longer than a distance between the first connector portion of the second connector and the connection portion corresponding to the second connector.

7. The light emission module according to claim 1, wherein the first light emission unit includes the first light emission elements, a condensing lens configured to condense light emitted from the first light emission elements, a wavelength conversion member where light that is condensed is incident, and a collimating lens configured to collimate the first light emitted from the wavelength conversion member.

8. The light emission module according to claim 1, further comprising:
a second light emission unit including one or a plurality of second light emission elements and being configured to emit a second light, the second light having a peak wavelength different from a peak wavelength of the first light;
a second optical member configured to reflect a portion of the second light; and
a housing configured to surround the first light emission unit, the second light emission unit, the first optical member, and the second optical member.

9. The light emission module according to claim 8, wherein
the second light emission unit includes the second light emission elements, a condensing lens configured to condense the second light emitted from the second light emission elements, a diffusion plate configured to diffuse the second light that is condensed, and a collimating lens configured to collimate the second light that is diffused.

10. The light emission module according to claim 8, wherein
the first optical member reflects a portion of the first light and transmits a portion of the first light,
the second optical member reflects a portion of the second light and transmits a portion of the second light, and
the housing includes:
a first window portion configured to extract the first light and a portion of the second light traveling in a predetermined direction via the first optical member and the second optical member,
a second window portion configured to extract the first light traveling in a direction different from the predetermined direction via the first optical member; and
a third window portion configured to extract the second light traveling in a direction different from the predetermined direction via the second optical member.

11. The light emission module according to claim 10, further comprising:
a first light detection member configured to detect the first light exiting from the second window portion; and
a second light detection member configured to detect the second light exiting from the third window portion, wherein
the second window portion is provided between the first light detection member and the first light emission unit, and
the third window portion is provided between the second light detection member and the second light emission unit.

12. The light emission module according to claim 11, wherein
the third window portion includes a condensing lens configured to condense light incident on the third window portion, and
the second window portion does not include a condensing lens.

13. The light emission module according to claim 10, wherein
an area of an emission port serving as a light extraction port of the first window portion is greater than both an area of an emission port serving as a light extraction port of the second window portion and an area of an emission port serving as a light extraction port of the third window portion.

* * * * *